United States Patent
Hoskinson et al.

(10) Patent No.: US 12,020,116 B2
(45) Date of Patent: Jun. 25, 2024

(54) SINGLE FLUX QUANTUM SOURCE FOR PROJECTIVE MEASUREMENTS

(71) Applicant: D-WAVE SYSTEMS INC., Burnaby (CA)

(72) Inventors: Emile M. Hoskinson, Vancouver (CA); Reuble Mathew, Montreal (CA)

(73) Assignee: 1372934 B.C. LTD., Burnaby (CA)

( * ) Notice: Subject to any disclaimer, the term of this patent is extended or adjusted under 35 U.S.C. 154(b) by 750 days.

(21) Appl. No.: 17/054,284

(22) PCT Filed: May 6, 2019

(86) PCT No.: PCT/US2019/030914
§ 371 (c)(1),
(2) Date: Nov. 10, 2020

(87) PCT Pub. No.: WO2019/217313
PCT Pub. Date: Nov. 14, 2019

(65) Prior Publication Data
US 2021/0248506 A1    Aug. 12, 2021

Related U.S. Application Data

(60) Provisional application No. 62/670,509, filed on May 11, 2018.

(51) Int. Cl.
*G06N 10/00* (2022.01)
*B82Y 10/00* (2011.01)
(Continued)

(52) U.S. Cl.
CPC ............. *G06N 10/00* (2019.01); *G06N 3/044* (2023.01); *H03M 1/66* (2013.01); *B82Y 10/00* (2013.01);
(Continued)

(58) Field of Classification Search
CPC ........ G06N 10/00; G06N 3/044; G06N 10/40; G06N 10/60; H03M 1/66; H03K 3/30; H03K 3/38; B82Y 10/00
See application file for complete search history.

(56) References Cited

U.S. PATENT DOCUMENTS 4,275,314 A    6/1981 Fulton
4,785,426 A    11/1988 Harada et al.
(Continued)

FOREIGN PATENT DOCUMENTS

CN    106505962 A    3/2017
JP    2011524043 A    8/2011
(Continued)

OTHER PUBLICATIONS

Grajcar et al., "Adiabatic Quantum Evolution of Superconducting Flux Qubits," arXiv:cond-mat/0407405 v1, pp. 1-7, Jul. 15, 2004.
(Continued)

*Primary Examiner* — Manish S Shah
*Assistant Examiner* — Christian T Bryant
(74) *Attorney, Agent, or Firm* — Cozen O'Connor

(57) ABSTRACT

Devices, systems, and methods that include a qubit coupled to a projective-source digital-to-analog converter (PSDAC) for projective measurement of the qubit. A change in flux state of the PSDAC from a first flux state to a second flux state generates a fast-flux step or fast-step waveform that can be applied to the qubit to perform projective measurement of the qubit. For a quantum processor that includes a set of qubits wherein each qubit is coupled to a respective PSDAC, a shared trigger line can activate each PSDAC to generate a respective fast-flux step or fast-step waveform. Synchronization devices can synchronize the fast-flux steps or fast-step waveforms, allowing for projective readout of the set of qubits.

20 Claims, 8 Drawing Sheets

(51) Int. Cl.
  *G06N 3/044* (2023.01)
  *G06N 10/40* (2022.01)
  *G06N 10/60* (2022.01)
  *H03K 3/30* (2006.01)
  *H03K 3/38* (2006.01)
  *H03M 1/66* (2006.01)

(52) U.S. Cl.
  CPC .............. *G06N 10/40* (2022.01); *G06N 10/60* (2022.01); *H03K 3/30* (2013.01); *H03K 3/38* (2013.01)

(56) References Cited

U.S. PATENT DOCUMENTS

| | | |
|---|---|---|
| 4,947,118 A | 8/1990 | Fujimaki |
| 5,153,171 A | 10/1992 | Smith et al. |
| 5,248,941 A | 9/1993 | Lee et al. |
| 5,528,202 A | 6/1996 | Moline et al. |
| 6,356,078 B1 | 3/2002 | Ganther et al. |
| 6,437,413 B1 | 8/2002 | Yamaguchi et al. |
| 6,597,010 B2 | 7/2003 | Eriksson et al. |
| 6,627,915 B1 | 9/2003 | Ustinov et al. |
| 6,627,916 B2 | 9/2003 | Amin et al. |
| 6,670,630 B2 | 12/2003 | Blais et al. |
| 6,784,451 B2 | 8/2004 | Amin et al. |
| 6,822,255 B2 | 11/2004 | Tzalenchuk et al. |
| 6,838,694 B2 | 1/2005 | Esteve et al. |
| 6,885,325 B2 | 4/2005 | Omelyanchouk et al. |
| 6,897,468 B2 | 5/2005 | Blais et al. |
| 6,900,454 B2 | 5/2005 | Blais et al. |
| 6,943,368 B2 | 9/2005 | Amin et al. |
| 6,960,780 B2 | 11/2005 | Blais et al. |
| 6,979,836 B2 | 12/2005 | Zagoskin et al. |
| 6,984,846 B2 | 1/2006 | Newns et al. |
| 6,987,282 B2 | 1/2006 | Amin et al. |
| 7,015,499 B1 | 3/2006 | Zagoskin |
| 7,018,852 B2 | 3/2006 | Wu et al. |
| 7,042,005 B2 | 5/2006 | Il et al. |
| 7,109,593 B2 | 9/2006 | Freedman et al. |
| 7,135,701 B2 | 11/2006 | Amin et al. |
| 7,253,654 B2 | 8/2007 | Amin |
| 7,277,872 B2 | 10/2007 | Raussendorf et al. |
| 7,332,738 B2 | 2/2008 | Blais et al. |
| 7,335,909 B2 | 2/2008 | Amin et al. |
| 7,418,283 B2 | 8/2008 | Amin |
| 7,533,068 B2 | 5/2009 | Maassen et al. |
| 7,619,437 B2 | 11/2009 | Thom et al. |
| 7,624,088 B2 | 11/2009 | Johnson et al. |
| 7,639,035 B2 | 12/2009 | Berkley |
| 7,843,209 B2 | 11/2010 | Berkley |
| 7,876,248 B2 | 1/2011 | Berkley et al. |
| 7,880,529 B2 | 2/2011 | Amin |
| 7,898,282 B2 | 3/2011 | Harris et al. |
| 7,932,514 B2 | 4/2011 | Farinelli et al. |
| 7,969,805 B2 | 6/2011 | Thom et al. |
| 7,990,662 B2 | 8/2011 | Berkley et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,169,231 B2 | 5/2012 | Berkley |
| 8,190,548 B2 | 5/2012 | Choi |
| 8,195,596 B2 | 6/2012 | Rose et al. |
| 8,228,688 B2 | 7/2012 | Uchaykin et al. |
| 8,283,943 B2 | 10/2012 | Van Den Brink et al. |
| 8,355,765 B2 | 1/2013 | Uchaykin et al. |
| 8,421,053 B2 | 4/2013 | Bunyk et al. |
| 8,494,993 B2 | 7/2013 | Harris et al. |
| 8,536,566 B2 | 9/2013 | Johansson et al. |
| 8,686,751 B2 | 4/2014 | Van Den Brink et al. |
| 8,700,689 B2 | 4/2014 | Macready et al. |
| 8,786,476 B2 | 7/2014 | Bunyk et al. |
| 8,812,066 B2 | 8/2014 | Lanting et al. |
| 8,854,074 B2 | 10/2014 | Berkley |
| 8,933,695 B1 | 1/2015 | Kornev et al. |
| 8,951,808 B2 | 2/2015 | Ladizinsky et al. |
| 9,015,215 B2 | 4/2015 | Berkley et al. |
| 9,069,928 B2 | 6/2015 | Van Den Brink et al. |
| 9,183,508 B2 | 11/2015 | King |
| 9,335,385 B2 | 5/2016 | Lanting et al. |
| 9,361,169 B2 | 6/2016 | Berkley |
| 9,471,880 B2 | 10/2016 | Williams |
| 9,495,644 B2 | 11/2016 | Chudak et al. |
| 9,501,748 B2 | 11/2016 | Naaman et al. |
| 9,509,274 B2 | 11/2016 | Naaman et al. |
| 9,727,823 B2 | 8/2017 | Amin et al. |
| 9,768,371 B2 | 9/2017 | Ladizinsky et al. |
| 9,893,262 B2 | 2/2018 | Thompson et al. |
| 10,050,630 B2 | 8/2018 | Reagor et al. |
| 10,074,792 B1 | 9/2018 | Ferguson et al. |
| 10,333,047 B2 | 6/2019 | Gilbert et al. |
| 10,381,542 B2 | 8/2019 | Chang et al. |
| 10,404,214 B2 | 9/2019 | Szöcs et al. |
| 10,516,375 B2 | 12/2019 | Bell et al. |
| 10,528,886 B2 | 1/2020 | Boothby |
| 10,811,588 B2 | 10/2020 | Olivadese et al. |
| 10,938,346 B2 | 3/2021 | Berkley et al. |
| 10,943,180 B2 | 3/2021 | Abdo |
| 11,100,416 B2 | 8/2021 | Lanting et al. |
| 11,422,958 B2 | 8/2022 | Boothby et al. |
| 11,424,521 B2 | 8/2022 | Whittaker et al. |
| 2002/0121636 A1 | 9/2002 | Amin et al. |
| 2002/0188578 A1 | 12/2002 | Amin et al. |
| 2002/0190381 A1 | 12/2002 | Herr et al. |
| 2003/0055513 A1 | 3/2003 | Raussendorf et al. |
| 2003/0107033 A1 | 6/2003 | Tzalenchuk et al. |
| 2003/0121028 A1 | 6/2003 | Coury et al. |
| 2003/0169041 A1 | 9/2003 | Coury et al. |
| 2003/0173498 A1 | 9/2003 | Blais et al. |
| 2004/0000666 A1 | 1/2004 | Lidar et al. |
| 2004/0016918 A1 | 1/2004 | Amin et al. |
| 2004/0119061 A1 | 6/2004 | Wu et al. |
| 2004/0140537 A1 | 7/2004 | Il et al. |
| 2004/0155728 A1 | 8/2004 | Cheung et al. |
| 2004/0165454 A1 | 8/2004 | Amin et al. |
| 2004/0170047 A1 | 9/2004 | Amin et al. |
| 2004/0239319 A1 | 12/2004 | Tralshawala et al. |
| 2005/0082519 A1 | 4/2005 | Amin et al. |
| 2005/0184284 A1 | 8/2005 | Burkard et al. |
| 2005/0224784 A1 | 10/2005 | Amin et al. |
| 2005/0250651 A1 | 11/2005 | Amin et al. |
| 2005/0256007 A1 | 11/2005 | Amin et al. |
| 2006/0097746 A1 | 5/2006 | Amin |
| 2007/0096730 A1 | 5/2007 | Meyer et al. |
| 2007/0241747 A1 | 10/2007 | Morley et al. |
| 2008/0176750 A1 | 7/2008 | Rose et al. |
| 2009/0070402 A1 | 3/2009 | Rose et al. |
| 2009/0078931 A1 | 3/2009 | Berkley |
| 2009/0082209 A1 | 3/2009 | Bunyk et al. |
| 2009/0121215 A1 | 5/2009 | Choi |
| 2009/0122508 A1 | 5/2009 | Uchaykin et al. |
| 2009/0168286 A1 | 7/2009 | Berkley et al. |
| 2009/0206871 A1 | 8/2009 | Baumgardner et al. |
| 2009/0289638 A1 | 11/2009 | Farinelli et al. |
| 2009/0319757 A1 | 12/2009 | Berkley |
| 2010/0097056 A1 | 4/2010 | Lam et al. |
| 2011/0031462 A1 | 2/2011 | Jedema et al. |
| 2011/0060780 A1 | 3/2011 | Berkley et al. |
| 2011/0089405 A1 | 4/2011 | Ladizinsky et al. |
| 2012/0023053 A1 | 1/2012 | Harris et al. |
| 2012/0094838 A1 | 4/2012 | Bunyk et al. |
| 2012/0098594 A1 | 4/2012 | Zmuidzinas et al. |
| 2012/0159272 A1 | 6/2012 | Pesetski et al. |
| 2013/0278283 A1 | 10/2013 | Berkley |
| 2014/0223224 A1 | 8/2014 | Berkley |
| 2014/0229722 A1 | 8/2014 | Harris |
| 2015/0032993 A1 | 1/2015 | Amin et al. |
| 2015/0032994 A1 | 1/2015 | Chudak et al. |
| 2015/0111754 A1 | 4/2015 | Harris et al. |
| 2015/0119252 A1 | 4/2015 | Ladizinsky et al. |
| 2016/0079968 A1 | 3/2016 | Strand et al. |
| 2016/0112031 A1 | 4/2016 | Abraham et al. |
| 2016/0125309 A1 | 5/2016 | Naaman et al. |
| 2016/0233860 A1 | 8/2016 | Naaman |

(56) References Cited

U.S. PATENT DOCUMENTS

| | | | |
|---|---|---|---|
| 2016/0364653 | A1 | 12/2016 | Chow et al. |
| 2017/0085231 | A1 | 3/2017 | Abdo |
| 2017/0178018 | A1* | 6/2017 | Tcaciuc ............... H05K 1/0233 |
| 2017/0344898 | A1 | 11/2017 | Karimi et al. |
| 2018/0145631 | A1* | 5/2018 | Berkley .................... H01P 7/08 |
| 2018/0218279 | A1 | 8/2018 | Lechner et al. |
| 2018/0330267 | A1* | 11/2018 | Rigetti .................... G06F 13/36 |
| 2018/0337322 | A1 | 11/2018 | Brink et al. |
| 2019/0019098 | A1 | 1/2019 | Przybysz |
| 2019/0019099 | A1 | 1/2019 | Hoskinson et al. |
| 2020/0342959 | A1 | 10/2020 | Tavernelli et al. |
| 2021/0248506 | A1 | 8/2021 | Hoskinson et al. |
| 2021/0265964 | A1 | 8/2021 | Miano et al. |
| 2022/0207404 | A1 | 6/2022 | Boothby |

FOREIGN PATENT DOCUMENTS

| | | | |
|---|---|---|---|
| JP | 2016515233 | A | 5/2016 |
| JP | 2018500784 | A | 1/2018 |
| SU | 539333 | A1 | 12/1976 |
| WO | 0227653 | A2 | 4/2002 |
| WO | 2005093649 | A1 | 10/2005 |
| WO | 2005109565 | A1 | 11/2005 |
| WO | 2007085074 | A1 | 8/2007 |
| WO | 2008022410 | A1 | 2/2008 |
| WO | 2009099972 | A2 | 8/2009 |
| WO | 2009120638 | A2 | 10/2009 |
| WO | 2010042735 | A2 | 4/2010 |
| WO | 2012155329 | A1 | 11/2012 |
| WO | 2014123980 | A1 | 8/2014 |
| WO | 2014135749 | A1 | 9/2014 |
| WO | 2016127021 | A1 | 8/2016 |
| WO | 2016183213 | A1 | 11/2016 |
| WO | 2017192733 | A2 | 11/2017 |
| WO | 2018111242 | A1 | 6/2018 |
| WO | 2020188269 | A1 | 9/2020 |
| WO | 2023091936 | A1 | 5/2023 |
| WO | 2023107955 | A1 | 6/2023 |

OTHER PUBLICATIONS

Han et al., "Time-Resolved Measurement of Dissipation-Induced Decoherence in a Josephson Junction," Science 293:1457-1459, Aug. 24, 2001.
Harris et al., "A Compound Josephson Junction Coupler for Flux Qubits with Minimal Crosstalk," arXiv:0904.37841 [cond-mat.supr-con] Apr. 24, 2009, 4 pages.
Harris et al., "Sign and Magnitude Tunable Coupler for Superconducting Flux Qubits," arXiv:cond-mat/0608253v1 [cond-mat.supr-con], Aug. 11, 2006. 5 pages.
Harris et al., "Experimental Demonstration of a Robust and Scalable Flux Qubit," arXiv:0909.4321v1, Sep. 24, 2009, 20 pages.
Harris et al., "Experimental Investigation of an Eight-Qubit Unit Cell in a Superconducting Optimization Processor," arXiv:1004.1628v2, Jun. 28, 2010, 16 pages.
Il'ichev et al., "Continuous Monitoring of Rabi Oscillations in a Josephson Flux Qubit," Physical Review Letters 91(9):097906-1-097906-4, week ending Aug. 29, 2003.
Inokuchi et al., "Analog computation using quantum-flux parametron devices," Physica C 357-360 :1618-1621, 2001.
International Search Report and Written Opinion for PCT/US2019/018792 dated Jun. 3, 2019, 13 pages.
International Search Report, dated Sep. 30, 2016, for PCT/US2016/031885, 4 pages.
Ioffe et al., "Environmentally decoupled sds-Wave Josephson junctions for quantum computing", Nature 398, pp. 679-681 (1999).
Ramos et al., "Design for Effective Thermalization of Junctions for Quantum Coherence," IEEE Transactions on Applied Superconductivity 11(1):998-1001, Mar. 2001.
Johnson, et al; "A scalable control system for a superconducting adiabatic quantum optimization processor", Superconductor Science and Technology; IOP Publishing; Supercond. Sci. Technol. 23 (2010); vol. 23, No. 6, Jun. 1, 2010, 12 pages.
Kim et al., "Coupling of Josephson Current Qubits Using a Connecting Loop," Physical Review B 70:184525-1-184525-6, 2004.
Lang, "Analog was not a Computer Trademark!," Sound & Vibration:16-24, Aug. 2000.
Lantz et al., "Josephson Junction Qubit Network with Current-Controlled Interaction," Proceedings of the Fourth International Workshop on Macroscopic Quantum Coherence and Computing (MQC2'04), Jun. 7-10, 2004, 13 pages.
Levinson, Principles of Lithography, the International Society for Optical Engineering, Bellingham, Washington, 2001. (Copy not submitted).
Lidar, "On the quantum computational complexity of the Ising spin glass partition function and of knot invariants," New Journal of Physics 6(167): 1-15, 2004.
Likharev et al., "Reversible Conveyor Computaion in Array of Parametric Quantrons", IEEE Transactions on Magnetics, Mar. 1, 1985.
Likharev, "Classical and Quantum Limitations on Energy Consumption in Computation," International Journal of Theoretical Physics 21(3/4):311-326, 1982.
Likharev, "Dynamics of Some Single Flux Quantum Devices: I. Parametric Quatron," IEEE Transactions on Magnetics MAG-13(1):242-244, 1977.
Lupaşcu et al., "High-contrast dispersive readout of a superconducting flux qubit using a nonlinear resonator" arXiv:cond-mat/0601634 [cond-mat.mes-hall], Jan. 27, 2006.
Maassen van den Brink et al., "Tunable Coupling of flux qubits through a simple flux transformer".
Maassen van den Brink et al., "Analog Processor Comprising Quantum Devices," U.S. Appl. No. 60/705,503, filed Aug. 3, 2005, 71 pages.
Madou, Fundamentals of Microfabrication: The Science of Miniaturization, CRC Press, 2002, pp. 1-14.
Majer et al., "Spectroscopy on Two Coupled Superconducting Flux Qubits," Physical Review Letters 94:090501-1-090501-4, 2005.
Makhlin et al., "Quantum-state engineering with Josephson-junction devices," Reviews of Modern Physics 73(2):357-400, Apr. 2001.
Martinis et al., "Rabi Oscillations in a Large Josephson-Junction Qubit," Physical Review Letters 89(11):117901-1-117901-4, Sep. 9, 2002.
Mooij et al., "Josephson Persistent-Current Qubit," Science 285:1036-1039, Aug. 13, 1999.
Murray et al., "Coupling Methods and Architectures for Information Processing," U.S. Appl. No. 11/247,857, filed Oct. 10, 2005, 73 pages.
Murray et al., "Coupling Schemes for Information Processing," U.S. Appl. No. 60/460,420, filed Dec. 30, 2004, 44 pages.
Nakamura et al., "Coherent control of macroscopic quantum states in a single-Cooper-pair-box," Nature 398:786-788, Apr. 29, 1999.
Nielsen et al., Quantum Computation and Quantum Information, Cambridge University Press, Cambridge, 2000, "7.8 Other implementation schemes," pp. 343-345.
Niskanen et al., "Quantum Coherent Tunable Coupling of Superconducting Qubits," Science 316:723-726, May 4, 2007.
Non-Final Office Action Issued in U.S. Appl. No. 16/975,646 dated Dec. 20, 2021, 24 pages.
Oppenländer et al., "Non-periodic Macroscopic Quantum Interference in One-Dimensional Parallel Josephson Junction Arrays With Unconventional Grating Structure" Physical Review B 63, Dec. 20, 2000.
Orlando et al., "Superconducting persistent-current qubit," Physical Review B 60(22):15398-15413, Dec. 1, 1999.
Ortlepp et al., "Access Time and Power Dissipation of a Model 256-Bit Single Flux Quantum RAM", IEEE Transactions on Applied Superconductivity, Sep. 2014.
Ortlepp et al., "Design guidelines for Suzuki stacks as reliable high-speed Josephson voltage drivers", Supercond. Sci. Technol., Jan. 21, 2013.
Paternosto et al., "Quantum-state transfer in imperfect artificial spin networks", Physical Review A 71, Jul. 7, 2004.

(56) References Cited

OTHER PUBLICATIONS

Petersan et al., "Measurement of resonant frequency and quality factor of microwave resonators: Comparison of methods," Journal of Applied Physics, vol. 84, No. 6, Sep. 15, 1998, 11 pages.
Planat et al., "A photonic crystal Josephson traveling wave parametric amplifier", Physical Review X, Apr. 28, 2020.
Plourde et al., "Entangling Flux Qubits with a Bipolar Dynamic Inductance," Physical Review B 70, arXiv:quant-ph/0406049v1, Jun. 8, 2004, 4 pages.
Pobell, "The 3He-4He Dilution Refrigerator", Springer-Verlag Berlin Heidelberg, Jun. 18, 1905.
Christopher Eichler et al., 'Controlling the dynamic range of a Josephson parametric amplifier', EPJ Quantum Technology, vol. 1, No. 2, Jan. 29, 2014.
International Search Report and Written Opinion, dated Apr. 18, 2023, for PCT/US2022/081029, 12 pages.
Japanese Office Action for JP 2021-513362, dated Apr. 13, 2023, 7 pages (with English Translation).
M. A. Castellanos-Beltran et al., 'A widely tunable parametric amplifier based on a SQUID array resonator', arXiv:0706.2373v1, Jun. 2007.
M. Hatridge et al., 'Dispersive magnetometry with a quantum limited SQUID parametric amplifier', arXiv:1003.2466v2, Dec. 2010.
T.C. White et al., 'Traveling wave parametric amplifier with Josephson junctions using minimal resonator phase matching', arXiv:1503.04364v1, Mar. 2015.
Vollmer, R., "Fast and scalable readout for fault-tolerant quantum computing with superconducting Qubits," Master's Thesis, QuTech, Department of Quantum Nanoscience, Delft University of Technology, Jul. 10, 2018, 80 pages.
Blais et al., Cavity Quantum Electrodynamics for Superconducting Electrical Circuits: An Architecture for Quantum Computation, Physical Review A 69(062320):1-14, 2004.
Boothby et al., "Architectural considerations in the design of a third-generation superconducting quantum annealing processor", arXiv: 2108.02322v1, Aug. 2021, pp. 3-4; and figure 4.
Chiorescu, et al. "Coherent Quantum Dynamics of a Superconducting Flux Qubit", Science Feb. 13, 2003, vol. 299, Issue 5614—pp. 1869-1871.
Heinsoo, J. et al., "Rapid high-fidelity multiplexed readout of superconducting qubits," arXiv:1801.07904v1 [quant-ph], Jan. 24, 2018, 13 pages.
Horsman, et al., "Surface code quantum computing by lattice surgery", 2012 Journal of Physics, 14 123011, 28 pages.
International Search Report and Written Opinion for PCT/US2022/079944 dated Mar. 13, 2023, 10 pages.
Po-Yu Kuo et al., 'A Novel Cross-Latch Shift Register Scheme for Low Power Applications', Applied Sciences, vol. 11, Dec. 2020, p. 2; and figure 5.
International Search Report and Written Opinion for PCT/US2019/030914 dated Sep. 4, 2019, 8 pages.
Lanting, Trevor, "Development of Quantum Annealing Technology at D-Wave Systems", retrieved from https://beyondcmos.omnl.gov/documents/Session2, Nov. 29, 2017, 25 pages.
Shulga, K.V., et al., "Magnetically induced transparency of a quantum," Nature Communications, Jan. 11, 2018, 6 pages.
Whittaker, J.D., et al., "A frequency and sensitivity tunable microresonator array for high-speed quantum," arXiv:1509.05811v2 [quant-ph], Apr. 22, 2016, 8 pages.
First Office Action—JP Application No. 2020-544663, dated Mar. 22, 2023, 13 pages.
Yates, S. J. C, et al., "Faster Fourier transform spectrometer readout for large arrays of microwave kinetic inductance detectors," University of Groningen, Applied Physics Letters, 2009, 5 pages.
Shnirman et al., "Quantum Manipulations of Small Josephson Junctions," Physical Review Letters 79(12): 2371-2374, Sep. 22, 1997.
Shor, "Introduction to Quantum Algorithms," AT&T Labs-Research, arXiv:quant-ph/0005003 v2, pp. 1-17, Jul. 6, 2001.
Strauch, Theory of Superconducting Phase Qubits, UMI Microform, Ann Arbor, Michigan, 2005, Chapter 8, "Conclusion," pp. 298-306.
Swenson et al., "Operation of a titanium nitride superconducting microresonator detector in the nonlinear regime," arXiv:1305.4281v1 [cond-mat.supr-con], May 18, 2013, 11 pages.
Tavares, "New Algorithms for Quadratic Unconstrained Binary Optimization (Qubo) With Applications in Engineering and Social Sciences", dissertation, Rutgers, May 1, 2008.
Tian, et al; "Projective Measurement Scheme for Solid-State Qubits"; arXiv:quant-ph/0310083v1; Oct. 13, 2021; 12 pages.
Van Dam, "Quantum Computing: In the 'Death Zone'?," Nature Physics 3:220-221, Apr. 2007.
Van Zant, "Microchip Fabrication", Fourth Edition, McGraw-Hill, New York, 2000. (book details provided).
Venugopal et al., "Dynamic Blocking and Collapsing for Gibbs Sampling", arXiv:1309.6870 [cs.AI], Sep. 1, 1993.
Volkmann, "Distributed resonator design for for Fortuna", Sep. 22, 2016.
Wang et al., "Fast Entanglement of Two Charge-Phase Qubits Through Nonadiabatic Couling to a Large Josephson Junction," Physical Review B 70:224515-1-224515-4, 2004.
Wei et al., "Quantum Computation with Josephson-Qubits by Using a Current-Biased Information Bus," arXiv:cond-mat/0407667 v1, pp. 1-13, Jul. 26, 2004.
White et al., "Traveling wave parametric amplifier with Josephson junctions using minimal resonator phase matching", Applied Physics Letters 106, Jun. 15, 2015.
Wocjan et al., "Treating the Independent Set Problem by 2D Ising Interactions with Adiabatic Quantum Computing," arXiv:quant-ph/0302027v1, pp. 1-13, Feb. 4, 2003.
Written Opinion, dated Sep. 30, 2016, for PCT/US2016/031885, 9 pages.
You et al., "Controllable Manipulation and Entanglement of Macroscopic Quantum States in Coupled Charge Qubits," Physical Review B 68:024510-1-024510-8, 2003.
You et al., "Fast Two-Bit Operations in Inductively Coupled Flux Qubits," arXiv:cond-mat/0309491 v1, pp. 1-5, Sep. 22, 2003.
Zorin et al., "Traveling-Wave Parametric Amplifier Based on Three-Wave Mixing in Josephson Metamaterial", arXiv:1705.02859 [cond-mat.supr-con], May 8, 2017.
Berkley, et al., "A scalable readout system for a superconducting adiabatic quantum optimization system", arXiv, May 6, 2009, 18 pages.
Bronn, et al., "Reducing Spontaneous Emission in Circuit Quantum electrodynamics by a Combined Readout/Filter Technique", arXiv:1504.04353 [quant-ph], 2015, 9 pages.
Casas, Juan, et al., "A Quantum Flux Parametron (QFP) 12-Bit Shift Register Capable of Stable Microwave Frequency Operation," Japanese Journal of Applied Physics vol. 30, No. 12B, Dec. 1991, pp. 3939-3942.
Chen, et al., Multiplexed dispersive readout of superconducting phase qubits, arXiv:1209.1781v1 [cond-mat.supr-con], 2012, 4 pages.
Colless, J. I, et al., "Cryogenic High-Frequency Readout and Control Platform for Spin Qubits," arXiv:1111.6440v2 [cond-mat.mes-hall], Nov. 29, 2011, 8 pages.
Day, Peter K, et al., "A broadband superconducting detector suitable for use in large arrays," Letters to Nature, Nature, vol. 425, Oct. 23, 2003, pp. 817-821.
Dicarlo, L., et al., "Preparation and Measurement of Three-Qubit Entanglement in a Superconducting Circuit," arXiv:1004.4324v1 [cond-mat.mes-hall,] Apr. 25, 2010, 9 pages.
Hornibrook, J. M, et al., "Frequency multiplexing for readout of spin qubits," Applied Physics Letters 104, 103108, 2014, 4 pages.
Jeffrey, et al., "Fast Scalable State Measurement with Superconducting Qubits", arXiv:1401.0257v3 [quant-ph], 2014, 9 pages.
Jerger, et al., "Frequency division multiplexing readout and simultaneous manipulation of an array of flux qubits", arXiv:1205.6375v2 [quant-ph], 2012, 4 pages.
Jerger, et al., "Spectroscopy of a Qubit Array via a Single Transmission Line", arXiv:1205.6375v2 [quant-ph], 2011, 3 pages.

(56) References Cited

OTHER PUBLICATIONS

Krantz, et al., "Single-shot Readout of a Superconducting Qubit using a Josephson Parametric Oscillator", arXiv:1508.02886v2 [quant-ph], 2016, 11 pages.
Majer, J., et al., "Coupling Superconducting Qubits via a Cavity Bus," arXiv:0709.2135v1 [cond-mat.mes-hall], Sep. 13, 2007, 6 pages.
Manzin, Benjamin A, et al., "Digital readouts for large microwave low-temperature detector arrays," Nuclear Instruments and Methods in Physics Research, Section A, 2006, 3 pages.
McClure, et al., "Rapid Driven Reset of a Qubit Readout Resonator", arXiv:1503.01456v2 [quant-ph]. 2015, 5 pages.
McKenney, et al., "Design considerations for a background limited 350 micron pixel array using lumped element superconducting microresonators", SPIE, Sep. 24, 2012, 10 pages.
Michotte, S., "Qubit dispersive readout scheme with a microstrip squid amplifier," arXiv:0812.0220v1 [cond-mat.supr-con], Dec. 1, 2008, 4 pages.
Monfardini, A., et al., "Nika: A millimeter-wave kinetic inductance camera," Astronomy & Astrophysics, 521, A29 2010, 6 pages.
Palacios-Laloy, A., et al., "Tunable Resonators for Quantum Circuits," J Low Temp Phys (2008) 151: 1034-1042.
Robertson, T. L, et al., "Superconducting quantum interference device with frequency-dependent damping: Readout of flux qubits," Physical Review B 72, 024513 (2005), 9 pages.
Sank, et al., "Measurement-Induced State Transitions in a Superconducting Qubit: Beyond the Rotating Wave Approximation", arXiv:1606.05721v2 [quant-ph], 2016, 10 pages.
Semenov, et al., "Classical and Quantum Operation Modes of the Reversible Logic Circuits," Department of Physics and Astronomy, Stony Brook University, Stony Brook, New York, Presentation, Dec. 2006, 29 pages.
Swenson, et al., "MAKO: A pathfinder instrument for on-sky demonstration of low-cost 350 micron imaging arrays", arXiv:1211.0315v1 [astro-ph.IM], 2012, 10 pages.
Volkmann, et al., "Low-dissipation multiplexed flux-sensitive readout in superconducting circuits", 2015 15th International Superconductive Electronics Conference (ISEC), 2015, 3 pages.
Wang, Z. L, et al., "Quantum state characterization of a fast tunable superconducting resonator," Applied Physics Letters 102, 163503 (2013), 4 pages.
Whittaker, et al., "Tunable-cavity QED with phase qubits", Physical Review, B 90, 024513, 2014, 15 pages.
Aaronson, "Thanksgiving Special: D-Wave at MIT," Shtetl-Optimized—The Blog of Scott Aaronson, URL=http://www.scottaaronson.com/blog/?p=291, retrieved Apr. 14, 2011 (originally retrieved Nov. 28, 2007), 54 pages.
B. H. Eom et al., "Wideband, Low-Noise Superconducting Amplifier with High Dynamic Range", arXiv:1201.2392v1 [cond-mat.supr-con], 2012, 23 pages.
Barenco et al., "Elementary gates for quantum computation," Physical Review A 52(5):3457-3467, Nov. 1995.
Barends R. et al., "Coherent Josephson qubit suitable for scalable quantum integrated circuits," arXiv:1304.2322v1 [quant-ph], Apr. 8, 2013, 10 pages.
Gao, Jiansong, "The Physics of Superconducting Microwave Resonators," Thesis, in Partial Fulfillment of the Requirements for the Degree of Doctor of Philosophy, California Institute of Technology Pasadena, California, May 28, 2008, 197 pages.
Bell et al., "Traveling Wave Parametric Amplifier based on a chain of Coupled Asymmetric SQUIDs", arXiv:1509.04573 [cond-mat.supr-con], Sep. 15, 2015.
Berkley, "Methods of Ferromagnetic and Adiabatic Classical Qubit State Copying," U.S. Appl. No. 60/675,139, filed Apr. 26, 2005, 63 pages.
Bertet et al., "Dephasing of a Superconducitng Qubit Nduced by Photon Noise", Physical Review Letters 95, Dec. 13, 2005.
Blais et al., "Tunable Coupling of Superconducting Qubits," Physical Review Letters 90(12):127901-1-127901-4, Mar. 28, 2003.
Blatter et al., "Design aspects of superconducting-phase quantum bits," Physical Review B 63: 174511-1-174511-9, 2001.
Bocko et al., "Prospects for Quantum Coherent Computation Using Superconducting Electronics," IEEE Transactions on Applied Superconductivity 7(2):3638-3641, Jun. 1997.
Garey et al., Computers and Intractability: A Guide to the Theory of NP-Completeness, W. H. Freeman and Company, New York, 1979, pp. 1-15.
Bryant et al., "Introduction to Electronic Analogue Computing," Physics& Mathematics, AEC Research and Development Report, pp. 2-50, Aug. 1966.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Chang, "Parametric Microwave Amplifications using a Tunable Superconducting Resonator", University of Waterloo Thesis, Jul. 7, 1905.
Chiarello, "Quantum computing with superconducting quantum interference devices: a possible strategy", Physics Letters A, Dec. 4, 2000.
Choudhury, Handbook of Microlithography, Micromachining and Microfabrication vol. 1: Microlithography, the International Society for Optical Engineering, Bellingham, Washington, 1997. (Copy not submitted).
Clarke et al., "Quiet Readout of Superconducting Flux States," Physica Scripta. T102: 173-177, 2002.
Communication Pursuant to Rule 164(1) EPC, dated Jun. 21, 2021, for European Application No. 19760892.0, 14 pages.
Communication Pursuant to Rule 164(1) EPC, dated Mar. 3, 2021, for European Application No. 19760892.0, 12 pages.
Cormen et al., Introduction to Algorithms, the MIT Press, Cambridge, Massachusetts, pp. 964-985, 2000.
Cosmelli et al., "Flux and phase qubits: techniques of operation".
Cosmelli, C., "Controllable Flux Coupling for the Integration of Flux Qubits," arXiv:cond-mat/0403690v1 [cond-mat.supr-con]. Mar. 29, 2004, 10 pages.
Deutsch, "Quantum theory, the Church-Turing principle and the universal quantum computer," Appeared in Proceedings of the Royal Society of London A 400: 97-117, 1985.
DiVincenzo, "The Physical Implementation of Quantum Computation," Fortschr. Phys. 48:771-783, 2000.
Drisko et al., "Impedance tuning with photoconducors to 40 GHz", IET Optoelectronics, Jan. 22, 2019.
European Search Report, dated Oct. 13, 2010, for EP 05849198.6, 10 pages.
Extended European search report for European Application No. 19799196.1, dated Feb. 18, 2022, 14 pages.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feldman et al., "Superconducting quantum computing without switches; quantum computing and quantum bits in mesoscopic systems", arXiv:quant-ph/0211158, Nov. 25, 2002.
Feynman, "Simulating Physics with Computers," International Journal of Theoretical Physics 21(6/7): 467-488, 1982.
Friedman et al., "Detection of a Schrodinger's Cat State in an rf-SQUID," arXiv:cond-mat/0004293 2:1-7, Apr. 19, 2000.
Friedman et al., "Quantum superposition of distinct macroscopic states," Nature 406:43-46, Jul. 6, 2000.
Abdo,t al., "Multi-Path Interferometric Josephson Directional Amplifier for Qubit Readout" arXiv:1710.02521v1 [physics.ins-det] Oct. 8, 2017, 17 pages.
Adbo, et al.,"Active protection of a superconducting qubit with an interferometric Josephson isolator", arXiv:1810.07234v1 [quant-ph] Oct. 16, 2018, 19 pages.
Banys, et al., "Millimetre Wave Kinetic Inductance Parametric Amplification using Ridge Gap Waveguide" arXiv:2111.06416v1 [cond-mat.supr-con] Nov. 11, 2021, 9 pages.
Beltran, "Development of a Josephson Parametric Amplifier for the Preparation and Detection of Nonclassical States of Microwave Fields" by Manuel Angel Castellanos Beltran B.S., Tecnológico de Monterrey, 2002, Thesis, 300 pages.

(56) References Cited

OTHER PUBLICATIONS

Bergeal, et al., Phase-preserving amplification near the quantum limit with a Josephson ring modulator, nature Letters, vol. 465| May 6, 2010| doi:10.1038/nature09035, 6 pages.

Castellanos, et al., "Amplification and squeezing of quantum noise with a tunable Josephson metamaterial", Letters, nature physics vol. 4 Dec. 2008 www.nature.com/naturephysics, 4 pages.

Chaudhuri, et al., "Broadband parametric amplifiers based on non-linear kinetic inductance artificial transmission lines", arXiv:1704.00859v1 [quant-ph] Apr. 4, 2017.

Farhi et al., "A quantum adiabatic evolution algorithm applied to random instances of an NP-Complete problem", Science, vol. 292, Apr. 20, 2001.

Krantz et al., "A quantum engineer's guide to superconducting qubits", Appl. Phys. Rev. 6, 021318 (2019), Jun. 20, 2019.

Macklin, "Quantum Feedback and Traveling-wave Parametric Amplification in Superconducting Circuits", https://escholarship.org/uc/item/41d554w, 2015, 152 pages.

Macklin, et al., "A near-quantum-limited Josephson traveling-wave parametric amplifier", Science Sciencemag. org,, Oct. 16, 2015 vol. 350, Issue 6258, 5 pages.

Macklin, et al., "Supplementary Materials for a near-quantum-limited Josephson traveling-wave parametric amplifier", Published Sep. 3, 2015 on Science Express DOI: 10.1126/science.aaa8525, 17 pages.

Malnou, et al., "Performance of a Kinetic-Inductance Traveling-Wave Parametric Amplifier at 4 Kelvin: Toward an Alternative to Semiconductor Amplifiers", arXiv:2110.08142v1 [quant-ph] Oct. 15, 2021, 11 pages.

Mutus, et al., "Design and characterization of a lumped element single-ended superconducting microwave parametric amplifier with on-chip flux bias", arXiv:1308.1376v3 [cond-mat.supr-con] Oct. 3, 2013, 5 pages.

Naaman, et al., "High Saturation Power Josephson Parametric Amplifier with GHz Bandwidth", arXiv:1711.07549v1 [physics.ins-det] Oct. 31, 2017, 5 pages.

Naaman, et al., "Josephson junction microwave modulators for qubit control", arXiv:1610.07987v2 [cond-mat.supr-con] Feb. 22, 2017, 18 pages.

O'Brien, et al., "Resonant Phase Matching of Josephson Junction Traveling Wave Parametric Amplifiers", Physical Review Letters, PRL 113, 157001, Oct. 10, 2014, 5 pages.

Parker, et al., "A near-ideal degenerate parametric amplifier", arXiv:2108.10471v2 [quant-ph] Aug. 26, 2021, 39 pages.

Planat, "Resonant and traveling-wave parametric amplificon near the quantum limit", Quantum coherence team Néel Insitute, Grenoble, 2020, 237 pages.

QrigJosephson Parametric Amplifiers: Theory and Application, Workshop on Microwave Cavity Design for Axion Detection Livermore Valley Open Campus Aug. 25-27, 2015, 56 pages.

Ribeill, "Qubit Readout with the Josephson Photomultiplier", Doctor of Philosophy, ProQuest No. 10077441, 2016, 200 pages.

Sivak, et al. "Josephson Array Mode Parametric Amplifier", arXiv:1909.08005v1 [quant-ph] Sep. 17, 2019, 14 pages.

Slichter, "Quantum Jumps and Measurement Backaction in a Superconducting Qubit", Doctor of Philosophy in Physics, 2011, 216 pages.

Spietz, et al., "Input impedance and gain of a gigahertz amplifier using a dc superconducting quantum interference device in a quarter wave resonator", Applied Physics Letters, 93, 082506 (2008); doi: 10.1063/1.2970967, 4 pages.

Spietz, et al., "Superconducting quantum interference device amplifiers with over 27 GHz of gain-bandwidth product operated in the 4-8 GHz frequency range", Appl. Phys. Lett. 95, 092505 (2009); doi: 10.1063/1.3220061, 4 pages.

Spiez, et al., "Noise performance of lumped element direct current superconducting quantum interference device amplifiers in the 4-8 GHz range", Appl. Phys. Lett. 97, 142502 (2010); doi: 10.1063/1.3497008, 4 pages.

Thorbeck, et al., "Reverse Isolation and Backaction of the SLUG Microwave Amplifier", Physical Review Applied 8, 054007 (2017), 6 pages.

Vijay, et al., "Observation of quantum jumps in a superconducting artificial atom", arXiv:1009.2969v3 [cond-mat.mes-hall] Feb. 25, 2011, 8 pages.

White, "Preserving entanglement during weak measurement demonstrated with a violation of the Bell-Leggett-Garg inequality", Doctor of Philosophy, 2015, 191 pages.

White, "Traveling Wave Parametric Amplifier With Josephson Junctions Using Minimal Resonator Phase Matching (Supplementary Information)", 2015, 10 pages.

Winkel, et al., "Non-degenerate parametric amplifiers based on dispersion engineered Josephson junction arrays", arXiv:1909.08037v1 [quant-ph] Sep. 17, 2019, 18 pages.

\* cited by examiner

SINGLE FLUX QUANTUM SOURCE FOR PROJECTIVE MEASUREMENTS

FIELD

This disclosure generally relates to devices, systems, and methods for projective measurement of a qubit by applying a fast-flux step to raise an energy barrier of the qubit. The disclosed techniques can be applied to a set of qubits that constitute a quantum processor for projective readout of the quantum processor.

BACKGROUND

Quantum Computation

A quantum computer is a system that makes direct use of at least one quantum-mechanical phenomenon, such as, superposition, tunneling, and entanglement, to perform operations on data. The elements of a quantum computer are qubits. Quantum computers can provide speedup for certain classes of computational problems such as computational problems simulating quantum physics.

Qubits

Qubits can be used as fundamental units of information for a quantum computer. A qubit contains two discrete physical states, which can also be labeled "0" and "1". Physically these two discrete states are represented by two different and distinguishable physical states of a quantum information storage device. For instance, these two discrete states can be represented by direction of magnetic field. If the physical quantity that stores these states behaves quantum mechanically, the device can additionally be placed in a superposition of 0 and 1. That is, the qubit can exist in both a "0" and "1" state at the same time, and so can perform a computation on both states simultaneously.

During quantum computation, the state of a qubit, in general, is a superposition of basis states so that the qubit has a nonzero probability of occupying the 10) basis state and a simultaneous nonzero probability of occupying the 11) basis state. The quantum nature of a qubit is largely derived from its ability to exist in a coherent superposition of basis states. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost and the superposition of basis states collapses to either the 10) basis state or the 11) basis state thus regaining its similarity to a conventional bit. The actual state of the qubit after it has collapsed depends on its 10) basis state or the 11) basis state probabilities (i.e., quantum state probabilities) immediately prior to the readout operation.

Digital-to-Analog Converters (DACs)

Quantum processors provide a plurality of programmable devices for performing computations with quantum effects. Programmable devices include qubits, couplers (which programmably couple qubits), and components thereof. Programmable devices are programmed via signals applied to influence their operation—for example, a biasing signal may be applied to a flux qubit to affect its flux during computation.

Some quantum processors require digital signals received from a classical computer to be converted to analog signals prior to being applied to programmable devices such as qubits. A digital-to-analog converter (DAC) can perform this conversion. A DAC can also store a signal received by the quantum processor before or during a computation until the signal is to be applied to a programmable device at a later time. DACs have many applications, and may be used for one or more of these purposes (i.e., conversion and/or memory) and/or for other purposes. Examples of applications of DACs for these and other purposes are described in greater detail in, for example, U.S. Pat. Nos. 7,876,248 and 8,098,179.

Superconducting quantum processors often comprise a plurality of DACs that may include superconducting DACs which store a flux, which generally comprise a storage inductor (e.g., a superconducting magnetic coil) and a variable inductance. For example, a DAC can comprise a loop of inductance in series with two Josephson junctions. Examples of DAC designs are described in greater detail in, for example, Johnson et al., "A scalable control system for a superconducting adiabatic quantum optimization processor", arXiv:0907.3757; and Bunyk et al., "Architectural considerations in the design of a superconducting quantum annealing processor", arXiv:1401.5504.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. Quantum annealing may use quantum effects, such as quantum tunneling, as a source of delocalization to reach an energy minimum more accurately and/or more quickly than classical annealing.

Adiabatic quantum computation may be considered a special case of quantum annealing. In adiabatic quantum computation, ideally, the system begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum Boltzmann Sampling

A quantum computer can be used for generating samples that can be used in machine learning. For instance, a quantum computer can generate samples for training a quantum Boltzmann machine. A Boltzmann machine is an implementation of a probabilistic graphical model that includes a graph with undirected weighted edges between vertices. The vertices (also called units) follow stochastic decisions about whether to be in an "on" state or an "off" state. The stochastic decisions are based on the Boltzmann distribution. A quantum Boltzmann machine can be implemented using a quantum computer, for example, a quantum annealer. Samples to train a quantum Boltzmann machine can also be generated from a quantum annealer.

Quantum Boltzmann sampling can include returning equilibrium samples from eigenstates of a quantum Hamiltonian. Samples can be taken from a quantum Boltzmann distribution and correspond to low-energy configurations of a Hamiltonian. For a quantum computer including a quantum annealer, samples can be taken a point between a start and an end of a quantum annealing schedule. Early in an anneal, quantum effects are strong but states are non-trivial because the problem energy scale is low. However, late in the anneal, quantum effects are weak and tunneling is incoherent, resulting in states that are mostly classical. At this point, the tunneling rate is below the decoherence rate. In order to enable quantum Boltzmann sampling (i.e., to measure the probabilities that the qubits will be in a 0 state or 1 state when quantum effects are strong), projective measurement of the qubits should ideally occur mid-anneal in the coherent regime when quantum effects are strong and states are non-trivial.

Quantum Boltzmann sampling can involve simultaneous measurement of the state of a set of qubits in a quantum processor at a point between a start and an end of an anneal. Projective measurement occurs when a qubit is measured to be in a 0 state or 1 state according to its quantum state probabilities and its state does not change any further after the measurement is performed, allowing a quantum measurement of spin states to occur. One approach to performing projective measurement is to quickly raise the energy barrier at a point between a start and an end of an anneal, thereby reducing the tunneling energy and freezing out the qubit to measure its spin state. If the energy barrier is raised quickly enough, measurement of the qubit will be projective. Mid-anneal projective measurements can enable quantum Boltzmann sampling (i.e., obtaining samples that are representative of a quantum Boltzmann distribution). Projective qubit measurements can also be used to improve quantum processor calibration by enabling mid-anneal measurements that would otherwise be difficult.

Typically, analog lines can be used to perform projective measurement of a qubit. However, analog lines that control the annealing can have a maximum bandwidth that can limit how fast the energy barrier is raised. Thus, projection of a qubit can occur relatively late in the anneal in an incoherent or low-coherence regime. In the incoherent or low-coherence regime, qubit dynamics are slow and quantum effects are small. To perform projective measurement in the coherent regime where quantum effects are stronger, thereby enabling quantum Boltzmann sampling, the energy barrier must be raised much faster than the speed at which existing analog lines will allow. One approach to raising the energy barrier faster is to increase the bandwidth of the analog control lines. For example, high-bandwidth coaxial lines can be implemented to communicatively couple a quantum processor to room-temperature electronics. However, the use of high-bandwidth analog lines has two main drawbacks. First, noise that is carried by these lines, which can corrupt quantum processor operation, increases with bandwidth. Second, the number of analog lines required increases as the number of qubits increases. The quantum processor requires an operating temperature on the order of milliKelvin which necessitates the use of a cryogenic refrigerator or cryostat. As the number of qubits scales up, the number of analog lines becomes unmanageable and the analog lines will not fit within the confines of the cryostat. Thus, there is a general desire for systems and methods for projective measurement and projective readout of a qubit without the use of high-bandwidth analog lines.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

There exists a need to be able to perform projective measurement and projective readout of a qubit and/or a quantum processor using scalable methods and devices which can are not limited by the confines of a cryogenic refrigerator. Systems, methods, and devices are described which, in at least some implementations, allow for projective measurement of a qubit and/or a quantum processor using on-chip devices and do not require the use of high-bandwidth analog lines.

A system for projective measurement of qubits in a quantum processor may be summarized as including a plurality of qubits, each qubit having a body loop and a Josephson Junction (JJ) loop; a plurality of projective-source digital-to-analog converters (PSDACs), each PSDAC having a body loop and a JJ loop, wherein each body loop of each PSDAC is communicatively coupled to the JJ loop of a respective qubit of the plurality of qubits; a trigger line communicatively coupled to the JJ loop of each PSDAC of the plurality of PSDACs, the trigger line operable to activate each PSDAC to change from a first flux state to a second flux state, wherein activating each PSDAC to change from a first flux state to a second flux state generates a respective fast flux step; and a plurality of synchronization devices, each synchronization device communicatively coupled to the JJ loop of a respective PSDAC of the plurality of PSDACs, wherein each synchronization device is operable to apply a bias to the JJ loop of the respective PSDAC to synchronize the fast flux step generated by the respective PSDAC with at least one other fast flux step generated by at least one other PSDAC of the plurality of PSDACs.

The plurality of synchronization devices may include a plurality of programmable magnetic memory digital-to-analog converters (PMM DACs), each PMM DAC having a body loop communicatively coupled to the JJ loop of a respective PSDAC, the body loop of the PMM DAC operable to apply a bias to the JJ loop of a respective PSDAC to synchronize the fast flux step generated by the respective PSDAC with at least one other fast flux step generated by at least one other PSDAC of the plurality of PSDACs. The plurality of synchronization devices may include a plurality of analog lines, each analog line communicatively coupled to the JJ loop of a respective PSDAC and operable to apply a bias to the JJ loop of a respective PSDAC to synchronize the fast flux step generated by the respective PSDAC with at least one other fast flux step generated by at least one other PSDAC of the plurality of PSDACs.

The first flux state of a first PSDAC of the plurality of PSDACs may be different from the first flux state of a second PSDAC of the plurality of PASDACs. A first fast flux step generated by a first PSDAC of the plurality of PSDACs may be applied to a JJ loop of a first qubit of the plurality of qubits to raise an energy barrier of the first qubit of the plurality of qubits. Each synchronization device may synchronize the first fast flux step generated by the first PSDAC of the plurality of PSDACs with a second fast flux step generated by a second PSDAC of the plurality of PSDACs. Synchronizing the first fast flux step generated by the first PSDAC of the plurality of PSDACs with a second fast flux step generated by a second PSDAC of the plurality of PSDACs may provide synchronized fast flux steps that are each applied to the JJ loop of the first qubit and a JJ loop of a second qubit of the plurality of qubits to raise an energy barrier of the first qubit and an energy barrier of the second qubit of the plurality of qubits. Each synchronization device may synchronizes the first fast flux step generated by the first PSDAC of the plurality of PSDACs with a plurality of fast flux steps generated by each PSDAC of the plurality of PSDACs. Synchronizing the first fast flux step generated by the first PSDAC of the plurality of PSDACs with a plurality of fast flux steps generated by each PSDAC of the plurality of PSDACs may provide synchronized fast flux steps that are each applied to a respective JJ loop of each qubit of the plurality of qubits to raise an energy barrier of each qubit of the plurality of qubits.

The system may further include a plurality of flux bias sources, wherein each flux bias source may be communicatively coupled to a body loop of a respective PSDAC and each flux bias source may be operable to apply a flux bias to the body loop of the respective PSDAC.

The system may further include a coupler communicatively coupling a first qubit of the plurality of qubits to a second qubit of the plurality of qubits, wherein the first qubit may be communicatively coupled to a first PSDAC of the plurality of PSDACs and the second qubit may be communicatively coupled to a second PSDAC of the plurality of PSDACs. The trigger line may be communicatively coupled to the JJ loop of the first PSDAC of the plurality of PSDACs and the trigger line may be further communicatively coupled to the JJ loop of the second PSDAC of the plurality of PSDACs. The JJ loop of first PSDAC of the plurality of PSDACs may be communicatively coupled to a first synchronization device of the plurality of synchronization devices and the JJ loop of the second PSDAC of the plurality of PSDACs may be communicatively coupled to a second synchronization device of the plurality of synchronization devices.

The system may further include a third PSDAC and a fourth PSDAC of the plurality of PSDACs, wherein the body loop of the third PSDAC of the plurality of PSDACs may be communicatively coupled to the body loop of the first qubit of the plurality of qubits and the body loop of the fourth PSDAC of the plurality of PSDACs may be communicatively coupled to the body loop of the second qubit of the plurality of qubits. The JJ loop of the third PSDAC of the plurality of PSDACs may be communicatively coupled to a second trigger line.

A method of operation of a system for projective measurement of a qubit in a quantum processor may be summarized as including a plurality of qubits, each qubit having a body loop and a Josephson Junction (JJ) loop; a plurality of projective-source digital-to-analog converters (PSDACs), each PSDAC having a body loop and a JJ loop, wherein each body loop of each PSDAC is communicatively coupled to the JJ loop of a respective qubit of the plurality of qubits; a trigger line communicatively coupled to the JJ loop of each PSDAC of the plurality of PSDACs, the trigger line operable to activate each PSDAC to change from a first flux state to a second flux state, wherein activating each PSDAC to change from a first flux state to a second flux state generates a respective fast flux step; and a plurality of synchronization devices, each synchronization device communicatively coupled to the JJ loop of a respective PSDAC of the plurality of PSDACs, wherein each synchronization device applies a bias to the JJ loop of the respective PSDAC, the method including initiating a quantum annealing evolution performed by the quantum processor; at a point during the quantum evolution: sending a signal through the trigger line to activate a PSDAC of the plurality of PSDACs; changing a flux state of the PSDAC of the plurality of PSDACs from a first flux state to a second flux state to generate a fast flux step; raising an energy barrier of a qubit of the plurality of qubits using the fast flux step; and measuring a spin state of the qubit of the plurality of qubits.

The method may further include synchronizing the first fast flux step generated by the first PSDAC of the plurality of PSDACs with a plurality of fast flux steps generated by a respective PSDAC of the plurality of PSDACS. Synchronizing the first fast flux step generated by the first PSDAC with a plurality of fast flux steps generated by a respective PSDAC of the plurality of PSDACs may provide synchronized fast flux steps that are each applied to a respective JJ loop of each qubit of the plurality of qubits. Applying synchronized fast flux steps to a respective JJ loop of each qubit of the plurality of qubits may raise a respective energy barrier of each qubit of the plurality of qubits. The method may further include completing the quantum evolution and reading out the spin state of the qubit of the plurality of qubits.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
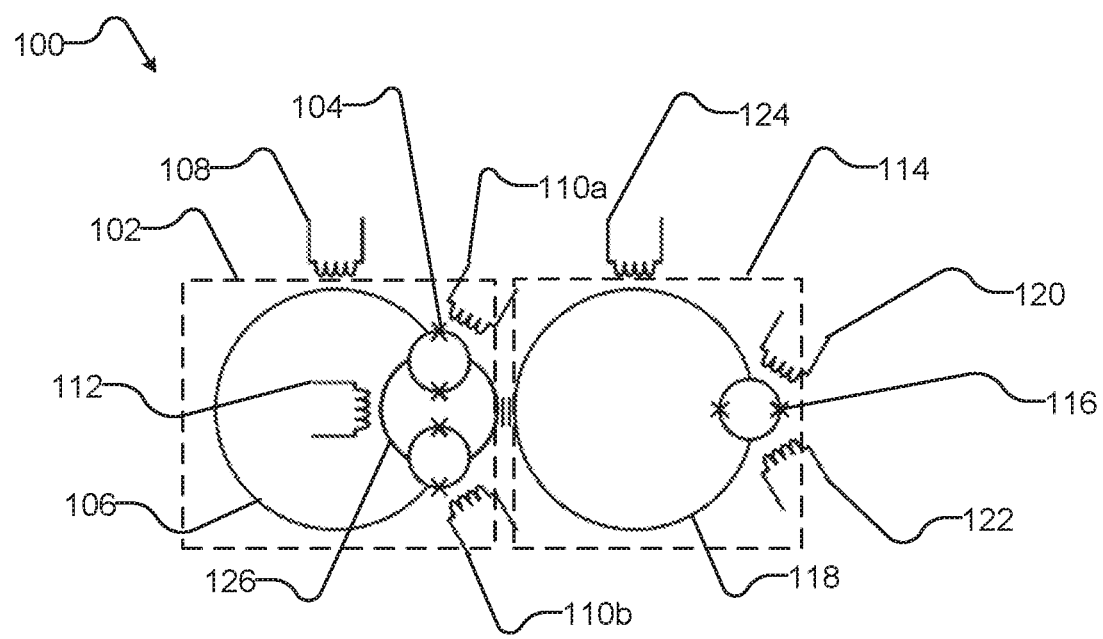
FIG. 1 is a schematic diagram illustrating a circuit for projective measurement of a qubit using changes in flux state of a projective source digital-to-analog converter (PSDAC).

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Sampling of qubit states at a point between a start and an end of an anneal can be useful for applications such as quantum Boltzmann sampling and quantum processor calibration. In quantum processor designs in which an analog line controls the annealing rate of a qubit, the transverse field or tunneling rate at which the state of the qubit can be projected is limited by analog line bandwidth. The present systems, methods, and devices describe a design in which digital-to-analog converters (DACs) are used as a single flux quantum source for projective measurement of a qubit. The time required for a DAC to change from a first flux state to a second flux state can be defined as the switching time and can be on the order of 10 s of picoseconds. As a result of a fast switching time, the transition between two flux states of a DAC can generate a fast flux step which can be used to drive projective readout of a qubit. In other words, the change in the flux states of DACs can drive quantum measurement of spin states at a point between a start and an end of an anneal. A DAC that generates a fast flux step for this purpose can be defined as a projective source DAC (PSDAC) or a fast flux step source. If each PSDAC in a set of PSDACs is respectively communicatively coupled to a qubit in a set of qubits on a quantum processor, then projective measurement can be performed on the set of qubits in the quantum processor by activating each PSDAC synchronously. If all PSDACs are activated synchronously to perform projective measurement on all qubits, projective readout of the entire quantum processor can be performed. Synchronous activation can be achieved by communicatively coupling each PSDAC to a shared trigger line and to a respective synchronization device. A synchronization device can correct for chip fabrication variations and shared trigger line phase delays that can lead to desynchronization. An example of a synchronization device is a conventional on-chip DAC or programmable magnetic memory (PMM) DAC that applies a bias to a PSDAC. The aforementioned design can be used as a tool for calibration and assessment of decoherence. An advantage of the design is it is a scalable system for control of qubits in the coherent regime because high bandwidth control lines are not required.

FIG. 1 is a schematic diagram illustrating a circuit 100 for projective measurement of a qubit 102 using changes in flux state of a PSDAC 108. Qubit 102 has a Josephson junction (JJ) loop 104 and a body loop 106. JJ loop 104 is a compound-compound JJ loop. In other implementations, JJ loop 104 can be a compound JJ loop. Body loop 106 is communicatively coupled to a flux bias source 108. Flux bias source 108 applies a bias to qubit 102 via inductive coupling. In some implementations, flux bias source 108 can be an analog line. In some implementations, flux bias source 108 can be a conventional DAC such as a programmable magnetic memory (PMM) DAC. JJ loop 104 of qubit 102 is also communicatively coupled to an annealing line 112. Annealing line 112 at least partially controls the anneal schedule of qubit 102 and raises the energy barrier of qubit 102 by applying a flux bias to a major lobe 126 of JJ loop 104. Annealing line 112 can be further communicatively coupled to at least one other qubit in a subset of qubits in a quantum processor. JJ loop 104 of qubit 102 is further communicatively coupled to a first minor lobe line 110a and a second minor lobe line 110b (collectively 110). Minor lobe lines 110 apply biases to JJ loop 104 of qubit 102 to compensate for JJ asymmetry and homogenize qubit 102 with at least one other qubit.

PSDAC 114 has a JJ loop 116 and a body loop 118. JJ loop 104 of qubit 102 is communicatively coupled to body loop 118 of PSDAC 114. Coupling can be inductive or galvanic. Body loop 118 of PSDAC 114 is further communicatively coupled to a single flux quantum (SFQ) flux bias source 124. SFQ flux bias source 124 applies a bias to body loop 118 of PSDAC 114 to enforce the direction of the signal generated by PSDAC 114 so that the energy barrier of qubit 101 is raised instead of lowered. The bias applied to body loop 118 of PSDAC 114 can be a programmable static flux bias. SFQ flux bias source 124 can be a conventional DAC such as a PMM DAC. In some implementations, SFQ flux bias source 124 can be an analog line. JJ loop 116 of PSDAC 118 is a compound JJ loop. In some implementations, JJ loop 116 can be a compound-compound JJ loop. JJ loop 116 of PSDAC 114 is communicatively coupled to a trigger line 120. In implementations where a set of PSDACs exists, trigger line 120 can be further communicatively coupled to each PSDAC of the set of PSDACs. Trigger line 120 activates PSDAC 114 to change the state of PSDAC 114 from a first flux state to a second flux state. Changing the state of PSDAC 114 from a first flux state to a second flux state can occur within 10 s of picoseconds. A change in flux state of PSDAC 114, which is coupled to JJ loop 104 of qubit 102, generates a fast flux step or fast-step waveform. The fast flux step or fast-step waveform can be applied to major lobe 126 of JJ loop 104 to raise the energy barrier of qubit 102. Trigger line 120 can activate PSDAC 114 at a point between a start and an end of an anneal. In some implementations, trigger line 120 can be an analog line with a bandwidth of at least 30 MHz. JJ loop 116 of PSDAC 114 is further coupled to a synchronization device 122. Synchronization device 122 can be a conventional DAC such as a PMM DAC. In some implementations, synchronization device 122 can be an analog line. Synchronization device 122 applies a bias to JJ loop 116 of PSDAC 114 to at least partially offset phase delays that can desynchronize the switching time of PSDAC 114 with other PSDACs in a quantum processor. Synchronization device 122 can synchronize the fast flux step generated by PSDAC 114 with at least one other fast flux step generated by at least one other PSDAC in the quantum processor. In some implementations, synchronization device 122 can at least partially correct for quantum processor fabrication variation in, for example, JJ loops.

Figure 2:
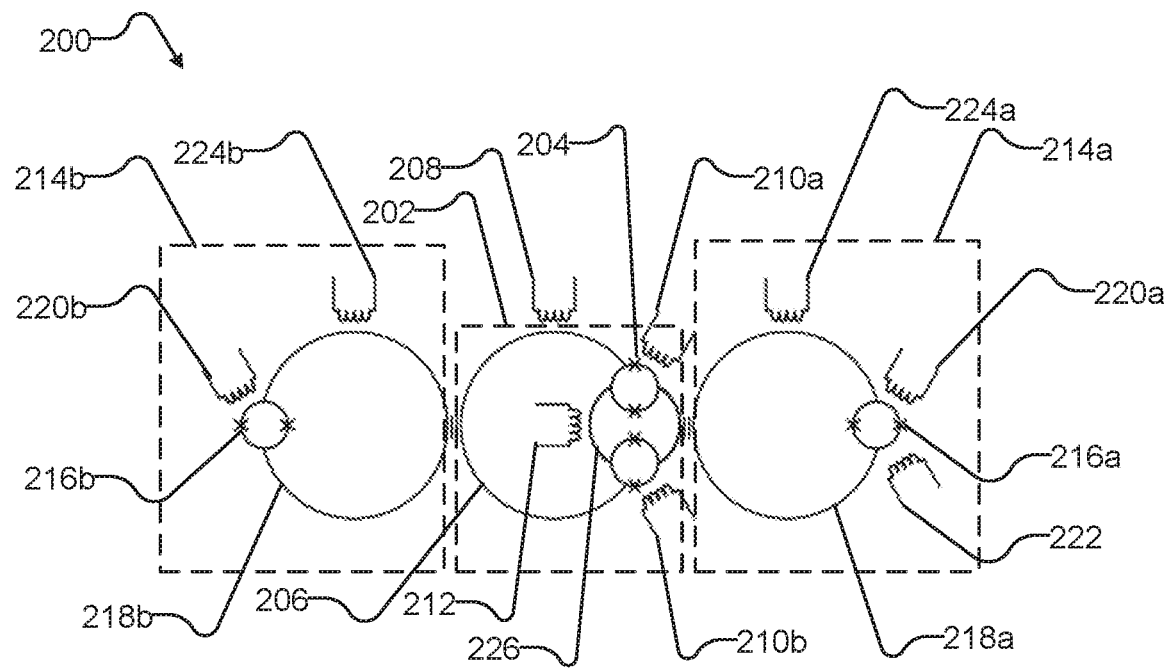
FIG. 2 is a schematic diagram illustrating a circuit for projective measurement of a qubit using changes in flux state of a set of two PSDACs that each have a compound Josephson Junction (JJ) loop.

FIG. 2 is a schematic diagram illustrating a circuit 200 for projective measurement of a qubit 202 using changes in flux state of a first PSDAC 214a and a second PSDAC 214b (collectively 214). Circuit 200 includes at least some of the same elements of circuit 100 of FIG. 1. Qubit 202 has a JJ loop 204 and a body loop 206. JJ loop 204 is a compound-compound JJ loop. In some implementations, JJ loop 204 can be a compound JJ loop. Body loop 206 is communicatively coupled to a flux bias source 208. Flux bias source 208 applies a bias to qubit 202 via inductive coupling or galvanic coupling. JJ loop 204 of qubit 202 is communicatively coupled to an annealing line 212. Annealing line 212 at least partially controls the anneal schedule of qubit 202 and raises the energy barrier of qubit 202 by applying a flux bias to a major lobe 226 of JJ loop 204. Annealing line 212 can be further communicatively coupled to at least one other qubit in a subset of qubits in a quantum processor. JJ loop 204 of qubit 202 is further communicatively coupled to a first minor lobe line 210a and a second minor lobe line 210b (collectively 210). Minor lobe lines 210 apply biases to JJ loop 204 of qubit 202 to compensate for JJ asymmetry and to homogenize qubit 202 with at least one other qubit.

First PSDAC 214a and second PSDAC 214b each include a respective a JJ loop 216a, 216b (collectively 216) and a respective body loop 218a, 218b (collectively 218). JJ loop 204 of qubit 202 is communicatively coupled to body loop 218a of first PSDAC 214a. Coupling can be inductive or galvanic. Body loops 218 of PSDACs 214 are each communicatively coupled to a respective SFQ flux bias source 224a, 224b (collectively 224). SFQ flux bias sources 224 apply a bias to respective body loops 218 of PSDACs 214 to enforce the direction of signals generated by PSDACs 214 so that the energy barrier of qubit 202 is raised instead of lowered. The bias applied to body loops 218 of PSDACs 214 can be a programmable static flux bias. SFQ flux bias sources 224 can be conventional DACs, such as PMM DACs, or analog lines. In one implementation, SFQ flux bias source 224a is a conventional DAC and SFQ flux bias source 224b is an analog line. JJ loops 216 of PSDACs 214 are compound JJ loops. In some implementations, JJ loops 216 of PSDACs 214 can be compound-compound JJ loops. JJ loops 216 of PSDACs 214 are each communicatively coupled to a respective trigger line 220a, 220b (collectively 220). In implementations that include a set of PSDACs, trigger line 220a can be further communicatively coupled to each PSDAC of the set of PSDACs. Trigger lines 220 activate PSDACs 214 to change the state of PSDACs 214 from a first flux state to a second flux state. In one implementation, the first flux state of first PSDAC 214a is different from the first flux state of second PSDAC 214b. Changing the state of PSDACs from the first flux state to the second flux state can occur within a time frame of 10 s of picoseconds. Changing the flux state of first PSDAC 214a, which is coupled to JJ loop 204 of qubit 202 via body loop 218a, generates a fast flux step or fast-step waveform. The fast flux step or fast-step waveform can be applied to major lobe 226 of JJ loop 204 to raise the energy barrier of qubit 202. Changing the flux state of second PSDAC 214b, which is coupled to body loop 206 of qubit 202 via body loop 218b, generates a fast flux step or fast-step waveform that can be used to prepare spin states for qubit 202. Second PSDAC 214b can increase or decrease the bias applied on body loop 206 of qubit 202. Qubit 202 is at degeneracy if flipping its state does not change its energy or the energy of other qubits in the quantum processor. Trigger lines 220 can activate PSDACs 214 at a point between a start and an end of an anneal. In some implementations, trigger lines can be analog lines that have a bandwidth of at least 30 MHz. JJ loop 216a of first PSDAC 214a is further coupled to a synchronization device 222. Synchronization device 222 can be a conventional DAC such as a PMM DAC or an analog line. Synchronization device 222 applies a bias to JJ loop 216a of first PSDAC 214a to at least partially offset phase delays that can desynchronize the switching time of first PSDAC 214a with the switching time of other PSDACs 214 in a quantum processor. Synchronization device 222 can synchronize the fast flux step generated by PSDAC 214a with at least one other fast flux step generated by at least one other PSDAC in the quantum processor. Synchronization device 222 can at least partially correct for quantum processor fabrication variation. In some implementations, a second synchronization device can be communicatively coupled to JJ loop 216b of second PSDAC 214b. The second synchronization device can operate in a similar manner to synchronization device 222.

In one implementation, flux bias source 208 applies a bias to body loop 206 of qubit 202 to initialize qubit 202 in a given spin configuration. Subsequently, when qubit 202 is in the coherent regime and the energy barrier is low, trigger lines 220 activate PSDACs 214 to remove the bias. Next, when qubit 202 undergoes coherent quantum evolution, trigger lines 220 activate PSDACs 214 to change from a first flux state to a second flux state to generate a fast-step waveform or fast flux step. The fast-step waveform or fast flux step can be used to perform a projective quantum measurement of qubit 202. The same approach can be applied to a plurality of qubits to initialize the plurality of qubits in a given spin configuration and perform a projective quantum measurement. In cases that include a plurality of qubits, synchronization devices 222 and trigger lines 224 can be employed in the same way as described above. The approach allows for initiating quantum evolution and monitoring the quantum evolution. The approach can be used as a quantum processor mode of operation on fast time scales in the coherent regime.

PSDAC body loop 218a and annealing line 212 are each coupled to major lobe 226 of qubit 202. In some cases, annealing line 212 can be indirectly coupled to PSDAC body loop 218 via major lobe 226. PSDAC body loop 218 can be susceptible to flux from annealing line 212. Annealing line 212 can generate a circulating current in PSDAC body loop 218, causing PSDAC body loop 218 to bias JJ loop 204 of qubit 202. This can result in changes of a net mutual inductance between annealing line 212 and JJ loop 204. Thus, PSDAC 214 can affect the communicative coupling between annealing line 212 and JJ loop 204, resulting in undesirable crosstalk between devices. The degree to which PSDAC 214 can affect the communicative coupling between annealing line 212 and JJ loop 204 can be proportional to a signal carried by trigger line 220a. As trigger line 220a is ramped up (i.e., a waveform is generated), the coupling strength of annealing line 212 to JJ loop 204 can increase, which affects the net mutual inductance between annealing line 212 and JJ loop 204. This can be problematic because an unintended increase in coupling strength of annealing line 212 to JJ loop 204 caused by trigger line 220a can results in partial annealing of qubit 202.

One approach to mitigating the unintended increase in coupling strength of annealing line 212 to JJ loop 204 caused by trigger line 220a is to bias PSDAC 214 before annealing, also referred to as "pre-biasing". PSDAC 214 can be pre-biased using a combination of trigger line 220a, which can be a global analog trigger bias, and synchronization device 222 at a value close to the PSDAC 214 trigger level.

Pre-biasing PSDAC 214 can minimize the height of the waveform required to trigger PSDAC 214, thereby minimizing the changes in mutual inductance between annealing line 212 and JJ loop 204 caused by the waveform. The net value of the mutual inductance between annealing line 212 and JJ loop 204 including the pre-bias applied to PSDAC 214 can be used for annealing qubit 202. In some implementations, trigger line 220a can be a trigger device.

Annealing line 212 can be indirectly communicatively coupled to PSDAC 214 via JJ loop 204. As qubit 202 is annealed, PSDAC body loop 218a can yield a flux offset proportional to a bias applied to JJ loop 204. In some cases, the flux offset at a particular point during the anneal can be compensated using SFQ flux bias source 224a. In some cases, SFQ flux bias source 224a can be a flux bias DAC. The degree to which the flux offset in PSDAC body loop 218a can be compensated by SFQ flux bias source 224a can depends on the point in anneal schedule. Compensating the PSDAC body loop flux offset decreases variation of the energy barrier of qubit 202 when the trigger waveform is generated. By compensating the flux offset at a proper point in the anneal schedule, the current of PSDAC 214 can be lowered, thereby reducing the change in flux applied to JJ loop 204 and reducing unintended partial annealing.

Figure 3:
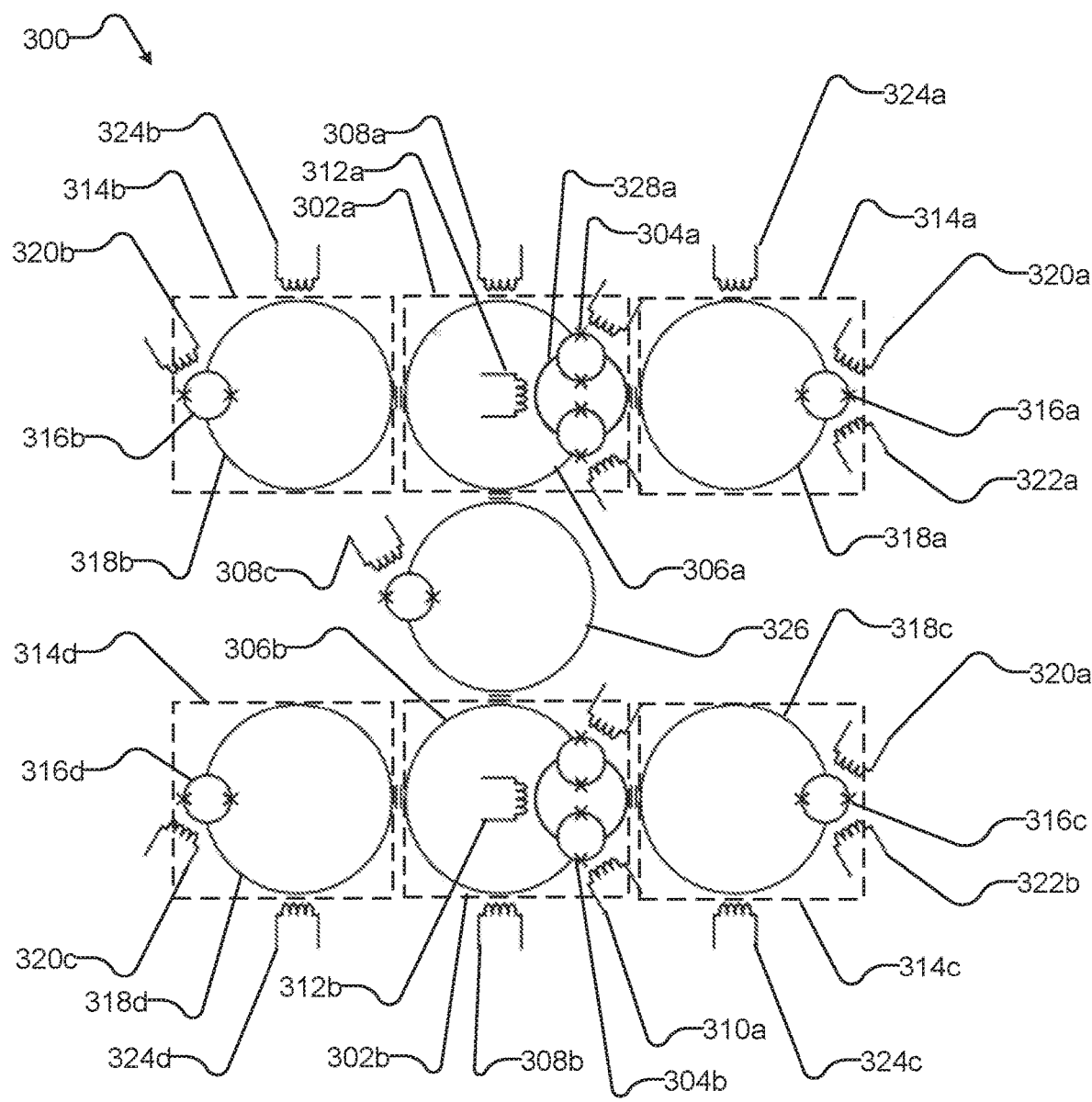
FIG. 3 is a schematic diagram illustrating a circuit for projective measurement of two communicatively coupled qubits using changes in flux state of a set of four PSDACs.

FIG. 3 is a schematic diagram illustrating a circuit 300 for projective measurement of two communicatively coupled qubits using changes in flux state of a set of PSDACs. Circuit 300 includes a first qubit 302a that is communicatively coupled to a second qubit 302b (collectively 302) via a coupler 326. Circuit 300 also includes a first PSDAC 314a, a second PSDAC 314b, a third PSDAC 314C, and a fourth PSDAC 314d (collectively 314). Circuit 300 includes at least some of the same elements of circuit 100 of FIG. 1 or circuit 200 of FIG. 2. Qubits 202 each have a respective JJ loop 304a, 304b (collectively 304) and a respective body loop 306a, 306b (collectively 306). JJ loops 304 are compound-compound JJ loops but, in some implementations, can be compound JJ loops. Body loops 306 are each communicatively coupled to a respective flux bias source 308a, 308b (collectively 308). Flux bias source 308a applies a bias to qubit 302a via inductive coupling or galvanic coupling. Body loops 306 of qubits 302 are further communicatively coupled to coupler 326. Qubits 302 can be inductively or galvanically coupled to coupler 326. Flux bias source 308c applies a bias to coupler 326. Flux bias source 308c at least partially determines the coupling strength between qubits 302 and the likelihood that qubits 302 will take the same spin state. JJ loops 304 of qubits 302 are each communicatively coupled to a respective annealing line 312a, 312b. Annealing lines 312 at least partially control the anneal schedule of qubits 302 and raise the energy barrier of qubits 302 by applying a flux bias to major lobes 328a (collectively 328, only one called out to avoid clutter) of JJ loops 304. In one implementation, first annealing line 312a is communicatively coupled to JJ loop 304a and further communicatively coupled to JJ loop 304b. In some implementations, first annealing line 312a is communicatively coupled to at least one other qubit in a subset of qubits in a quantum processor. JJ loops 304 of qubits 302 are further communicatively coupled to two respective minor lobe lines (310a, only one called out to avoid drawing clutter). Minor lobe lines 310 apply biases to JJ loops 304 of qubits 302 to compensate for JJ asymmetry and to homogenize qubits 302 with one another or with at least one other qubit in the quantum processor.

PSDACs 314 each include a respective JJ loop 316a, 316b, 316c, 316d (collectively 316) and a respective body loop 318a, 318b, 318c, 318d (collectively 318). Body loops 318 of PSDACs 314 are each communicatively coupled to a respective SFQ flux bias source 324a, 324b, 324c, 324d (collectively 324). SFQ flux bias sources 324 apply a bias to respective body loops 318 of PSDACs 314 to enforce the direction of signals generated by PSDACs 314 so that energy barriers of qubits 302 are raised instead of lowered. The bias applied to body loops 318 of PSDACs 314 can be a programmable static flux bias. SFQ flux bias sources 324 can be conventional DACs, such as PMM DACs, or analog lines. JJ loops 316 of PSDACs 314 are compound JJ loops. In some implementations, JJ loops 316 can be compound-compound JJ loops.

JJ loop 304a of first qubit 302a is communicatively coupled to body loop 318a of first PSDAC 314a. JJ loop 304b of second qubit 302a is communicatively coupled to body loop 318c of third PSDAC 314c. JJ loop 316a of first PSDAC 314a and JJ loop 316c of third PSDAC 314c are communicatively coupled to trigger line 220a. In some implementations that include a set of PSDACs, trigger line 220 can be further communicatively coupled to each PSDAC of the set of PSDACs. Trigger line 220a is a shared trigger line that activates first PSDAC 314a and third PSDAC 314c to change the state of PSDACs 314a, 314c from a first flux state to a second flux state. Changing from a first flux state to a second flux state for PSDACs 314a, 314c can occur synchronously or nearly synchronously as a result of sharing trigger line 220a. In one implementation, the first flux state of first PSDAC 314a is different from the first flux state of third PSDAC 314c. Changing the state of PSDACs from the first flux state to the second flux state can occur within a time frame of 10 s of picoseconds. Changing the flux state of first PSDAC 314a, which is coupled to first qubit 302a via JJ loop 304a, generates a first fast flux step or first fast-step waveform. Changing the flux state of third PSDAC 314c, which is coupled to second qubit 302b via JJ loop 304b, generates a second fast flux step or second fast-step waveform. The first fast flux step or first fast-step waveform can be synchronized with the second fast flux step or second fast-step waveform using synchronization devices 322. The synchronized fast flux steps can be applied to major lobes 328 of JJ loops 304 to raise the energy barrier of qubits 302 to perform projective measurement of qubits 302.

JJ loop 316a of first PSDAC 314a and JJ loop 316c of third PSDAC 314c are each communicatively coupled to a respective synchronization device 322a, 322b (collectively 322). Synchronization devices 322 can be conventional DACs, such as PMM DACs, or analog lines. Synchronization devices 322 each apply a bias to JJ loops 316a, 316c to at least partially offset phase delays in the signal carried by trigger line 320a that can desynchronize the switching time of first PSDAC 314a with the switching time of third PSDAC 314c. Synchronization devices 322 can synchronize the fast flux step generated by first PSDAC 314a with the fast flux step generated by third PSDAC 314c. In one implementation, synchronization device 322 can synchronize the fast flux step generated by first PSDAC 314a with at least one other fast flux step generated by at least one other PSDAC in the quantum processor. Synchronization devices 322 can at least partially correct for quantum processor fabrication variation.

Body loop 306a of first qubit 302a is communicatively coupled to body loop 318b of second PSDAC 314b. Body loop 306b of second qubit 302b is communicatively coupled to body loop 318d of fourth PSDAC 314d.

JJ loops 316b, 316d of PSDACs 314b, 314d are each communicatively coupled to a respective trigger line 320b, 320d (collectively 320). In one implementation, JJ loops 316d of PSDAC 314d can by communicatively coupled to trigger line 320b instead of trigger line 320d. Trigger lines 320 can activate PSDACs 314 at a point between a start and an end of an anneal. In some implementations, trigger lines can be analog lines that have a bandwidth of at least 30 MHz. Trigger lines 320b, 320d activate PSDACs 314b, 314d to change the state of PSDACs 314b, 314d from a first flux state to a second flux state. In one implementation, the first flux state of PSDAC 314b can be different from the first flux states of any of PSDACs 314a, 314c, 314d. Changing the state of PSDACs 314 from the first flux state to the second flux state can occur within a time frame of 10 s of picoseconds. Changing the flux state of second PSDAC 314b, which is coupled to body loop 306a of first qubit 302a via body loop 318b, generates a fast flux step or fast-step waveform that can be used to prepare spin states for first qubit 302a. Second PSDAC 314b can increase or decrease the bias applied to body loop 306a of qubit 302a. Changing the flux state of PSDAC 314d has a similar or identical operative effect on second qubit 302b as changing the flux state of PSDAC 314b has on first qubit 302a. In some implementations, additional synchronization devices can be communicatively coupled to JJ loops 316b, 316d of PSDACs 314b, 314d.

In some cases, it can be advantageous to generate a fast-flux pulse waveform that comprises a rising step followed by a falling step in quick succession. In some cases, the fast-flux pulse waveform can be trapezoidal. A fast-flux pulse can be achieved with a circuit comprising a PSDAC that includes two JJ loops in series.

Figure 4:
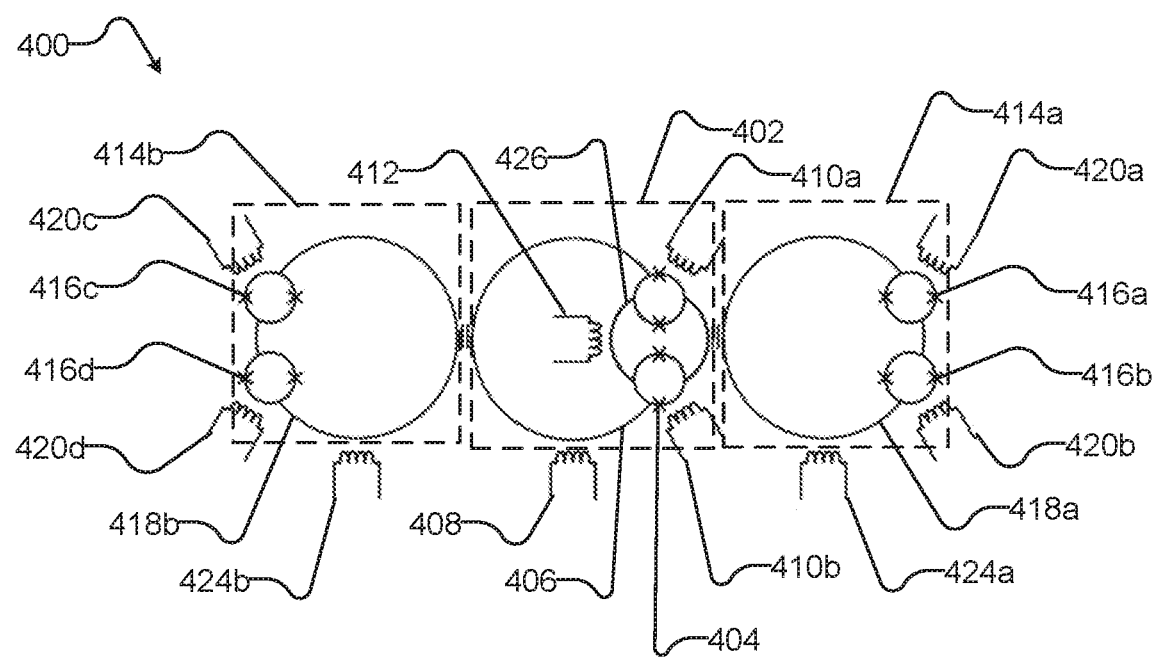
FIG. 4 is a schematic diagram illustrating a circuit for projective measurement of a qubit using changes in flux state of a set of two PSDACs that each have two compound JJ loops in series.

FIG. 4 is a schematic diagram illustrating a circuit 400 for projective measurement of a qubit 402 using changes in flux state of a first PSDAC 414a and a second PSDAC 414b (collectively 414). Circuit 400 includes at least some of the same elements of circuit 100 of FIG. 1. Qubit 402 has a JJ loop 404 and a body loop 406. JJ loop 404 is a compound-compound JJ loop. In some implementations, JJ loop 404 can be a compound JJ loop. Body loop 406 is communicatively coupled to a flux bias source 408. Flux bias source 408 applies a bias to qubit 402 via inductive coupling or galvanic coupling. JJ loop 404 of qubit 402 is communicatively coupled to an annealing line 412. Annealing line 412 at least partially controls the anneal schedule of qubit 402 and raises the energy barrier of qubit 402 by applying a flux bias to a major lobe 426 of JJ loop 404. Annealing line 412 can be further communicatively coupled to at least one other qubit in a subset of qubits in a quantum processor. JJ loop 404 of qubit 402 is further communicatively coupled to a first minor lobe line 410a and a second minor lobe line 410b (collectively 410). Minor lobe lines 410 apply biases to JJ loop 404 of qubit 402 to compensate for JJ asymmetry and to homogenize qubit 402 with at least one other qubit.

First PSDAC 414a includes two JJ loops 416a, 416b in series and a body loop 418a. Second PSDAC 414b includes two JJ loops 416c, 416d (collectively 416) in series and a body loop 418b (collectively 418). JJ loop 404 of qubit 402 is communicatively coupled to body loop 418a of first PSDAC 414a. Coupling can be inductive or galvanic. Body loops 418 of PSDACs 414 are each communicatively coupled to a respective SFQ flux bias source 424a, 424b (collectively 424). SFQ flux bias sources 424 each apply a bias to respective body loops 418 of PSDACs 414 to enforce the chosen direction of signals generated by PSDACs 414 so that the energy barrier of qubit 402 is either raised or lowered during the fast flux pulse. The bias applied to body loops 418 of PSDACs 414 can be a programmable static flux bias. SFQ flux bias sources 424 can be conventional DACs, such as PMM DACs, or analog lines. In one implementation, SFQ flux bias source 424a is a conventional DAC and SFQ flux bias source 424b is an analog line. JJ loops 416 of PSDACs 414 are compound JJ loops. In some implementations, JJ loops 416 of PSDACs 414 can be compound-compound JJ loops. JJ loops 416 of PSDACs 414 are each communicatively coupled to a respective a respective trigger line 420a, 420b, 420c, 420d (collectively 420).

Coupling trigger lines 420a, 420b to JJ loops 416a, 416b of first PSDAC 414a can allow for changing the flux state of first PSDAC 414a in opposite directions while maintaining a relatively constant magnitude of flux coupled from first PSDAC 414a to JJ loop 404 of qubit 402. Coupling trigger lines 420c, 420d to JJ loops 416c, 416d of second PSDAC 414b can allow for generation of a fast flux pulse in the body loop 406 of qubit 402. In one implementation, JJ loop 416b of PSDAC 414a is coupled to trigger line 420a instead of trigger line 420b. In implementations that include a set of PSDACs, trigger line 420a can be further communicatively coupled to each PSDAC of the set of PSDACs.

Trigger lines 420 activate PSDACs 414 to change the state of PSDACs 414 from a first flux state to a second flux state. In one implementation, the first flux state of first PSDAC 414a is different from the first flux state of second PSDAC 414b. Changing the state of PSDACs from the first flux state to the second flux state can occur within a time frame of 10 s of picoseconds. Changing the flux state of first PSDAC 414a, which is coupled to JJ loop 404 of qubit 402 via body loop 418a, generates a fast flux step, fast flux pulse, or fast-step waveform. The fast flux step, fast flux pulse, or fast-step waveform can be applied to major lobe 426 of JJ loop 404 to raise the energy barrier of qubit 402. Changing the flux state of second PSDAC 414b, which is coupled to body loop 406 of qubit 402 via body loop 418b, generates a fast flux step, fast flux pulse, or fast-step waveform that can be used to prepare spin states for qubit 402. Second PSDAC 414b can increase or decrease the bias applied on body loop 406 of qubit 402. Trigger lines 420 can activate PSDACs 414 at a point between a start and an end of an anneal. In some implementations, trigger lines can be analog lines that have a bandwidth of at least 30 MHz.

In one implementation, JJ loop 416a of first PSDAC 414a is coupled to a synchronization device instead of trigger line 420a. The synchronization device can be a conventional DAC such as a PMM DAC or an analog line. The synchronization device can at least partially offset phase delays that can desynchronize the switching time of first PSDAC 414a with the switching time of other PSDACs in a quantum processor. The synchronization device can synchronize the fast flux step generated by PSDAC 414a with at least one other fast flux step generated by at least one other PSDAC in the quantum processor.

In some cases, it can be advantageous to have two SFQ sources on a JJ loop of a qubit to attain a target timing resolution between SFQ pulses. This can be achieved with a circuit that includes two PSDACs coupled to a JJ loop of a qubit.

Figure 5:
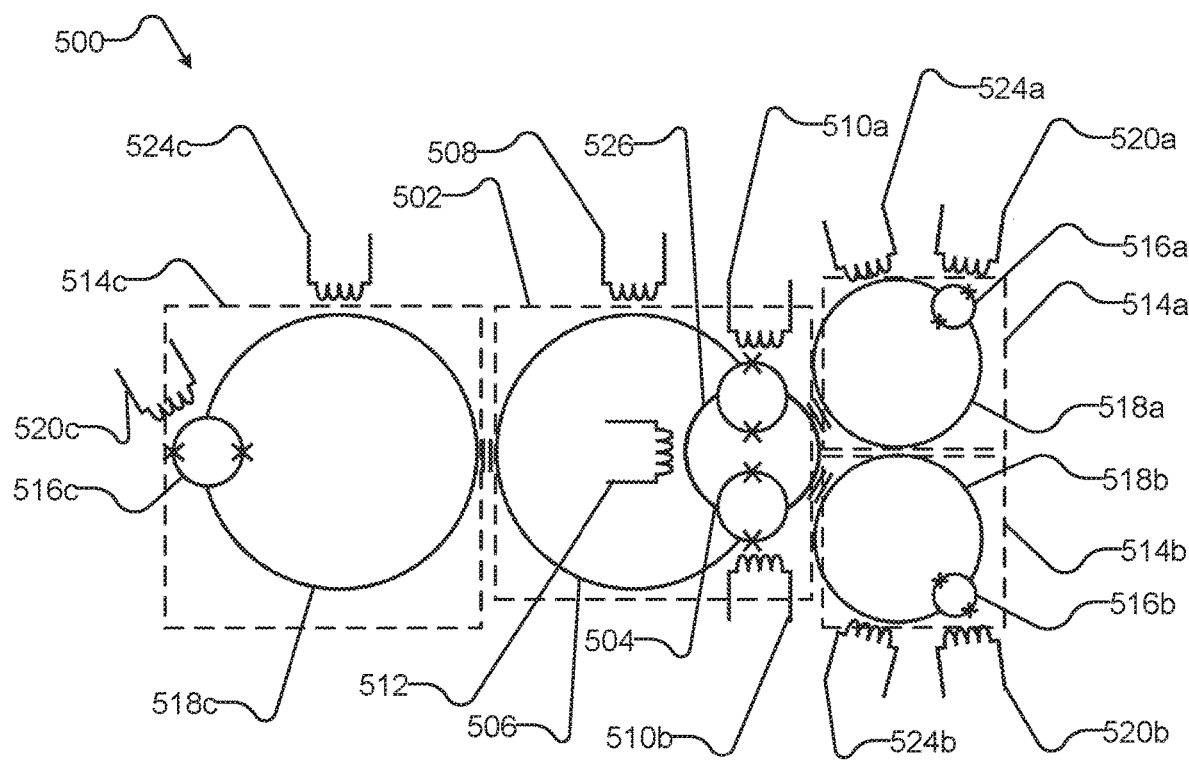
FIG. 5 is a schematic diagram illustrating a circuit for projective measurement of a qubit using changes in flux state of a set of three PSDACs.

FIG. 5 is a schematic diagram illustrating a circuit 500 for projective measurement of a qubit 502 using changes in flux state of a first PSDAC 514a, a second PSDAC 514b, and a third PSDAC 514c (collectively 514). Circuit 500 includes at least some of the same elements of circuit 100 of FIG. 1 and circuit 200 of FIG. 2. Qubit 502 has a JJ loop 504 and a body loop 506. JJ loop 504 is a compound-compound JJ loop. In some implementations, JJ loop 504 can be a compound JJ loop. Body loop 506 is communicatively coupled to a flux bias source 508. Flux bias source 508 applies a bias to qubit 502 via inductive coupling or galvanic coupling. JJ loop 504 of qubit 502 is communicatively coupled to an annealing line 512. Annealing line 512 at least partially controls the anneal schedule of qubit 502 and raises the energy barrier of qubit 502 by applying a flux bias to a major lobe 526 of JJ loop 504. Annealing line 512 can be further communicatively coupled to at least one other qubit in a subset of qubits in a quantum processor. JJ loop 504 of qubit 502 is further communicatively coupled to a first minor lobe line 510*a* and a second minor lobe line 510*b* (collectively 510). Minor lobe lines 510 apply biases to JJ loop 504 of qubit 502 to compensate for JJ asymmetry and to homogenize qubit 502 with at least one other qubit.

PSDACs 514*a*, 514*b*, 514*c* each include a respective JJ loop 516*a*, 516*b*, 516*c* (collectively 516) and a respective body loop 518*a*, 518*b*, 518*c* (collectively 518). JJ loop 504 of qubit 502 is communicatively coupled to body loop 518*a* of first PSDAC 514*a* and further communicatively coupled to body loop 518*b* of second PSDAC 514*b*. Coupling can be inductive or galvanic. Coupling JJ loop 504 of qubit 502 to first PSDAC 514*a* and second PSDAC 514*b* can allow for achieving a target timing resolution between SFQ pulses generated by PSDACs1 514*a*, 514*b*. In one implementation, coupling JJ loops 504 of qubit 502 to PSDACs 514*a*, 514*b* can allow for achieving sub-nanosecond timing. Body loop 506 of qubit 502 is communicatively coupled to body loop 518*c* of third PSDAC 514*c*. Body loops 518 of PSDACs 514 are each communicatively coupled to a respective SFQ flux bias source 524*a*, 524*b*, 524*c* (collectively 524). SFQ flux bias sources 524 each apply a bias to respective body loops 518 of PSDACs 514 to enforce the chosen direction of signals generated by PSDACs 514 so that the energy barrier of qubit 502 is either raised or lowered during the fast flux pulse. The bias applied to body loops 518 of PSDACs 514 can be a programmable static flux bias. SFQ flux bias sources 524 can be conventional DACs, such as PMM DACs, or analog lines. In one implementation, SFQ flux bias sources 524*a*, 524*b* are conventional DACs and SFQ flux bias source 524*c* is an analog line. JJ loops 516 of PSDACs 514 are compound JJ loops. In some implementations, at least one of JJ loops 516 of PSDACs 514 can be compound-compound JJ loops.

JJ loops 516 of PSDACs 514 are each communicatively coupled to a respective a respective trigger line 520*a*, 520*b*, 520*c* (collectively 520). In one implementation, one of trigger lines 520 can be further communicatively coupled to at least one other PSDAC in a quantum processor. Trigger lines 520 each activate a respective PSDAC 514 to change the state of the respective PSDAC 514 from a first flux state to a second flux state. In one implementation, the first flux state of first PSDAC 514*a* is different from the first flux state of third PSDAC 514*c*. Changing the state of PSDACs from the first flux state to the second flux state can occur within a time frame of 10 s of picoseconds. Changing the flux state of first PSDAC 514*a* and second PSDAC 514*b*, which are coupled to JJ loop 504 of qubit 502 via body loops 518*a*, 518*b*, generates a fast flux step, fast flux pulse, or fast-step waveform. The fast flux step, fast flux pulse, or fast-step waveform can be applied to major lobe 526 of JJ loop 504 to raise the energy barrier of qubit 502. Changing the flux state of third PSDAC 514*c*, which is coupled to body loop 506 of qubit 502 via body loop 518*c*, generates a fast flux step, fast flux pulse, or fast-step waveform that can be used to prepare spin states for qubit 502. Third PSDAC 514*c* can increase or decrease the bias applied on body loop 506 of qubit 502. Trigger lines 520 can activate PSDACs 514 at a point between a start and an end of an anneal. In some implementations, trigger lines can be analog lines that have a bandwidth of at least 30 MHz.

In one implementation, JJ loop 516*a* of first PSDAC 514*a* and JJ loop 516*b* of second PSDAC 514*b* are coupled to at least one synchronization device such as a conventional DAC (e.g., a PMM DAC) or an analog line. The synchronization device can at least partially offset phase delays that can desynchronize the switching time of at least one of PSDACs 514*a*, 514*b*, 514*c* with the switching time of other PSDACs in a quantum processor. The synchronization device can synchronize the fast flux step generated by at least one of PSDAC 514*a*, 514*b*, 514*c* with at least one other fast flux step generated by at least one other PSDAC in the quantum processor.

Projective measurement can be useful in measuring a qubit while it is undergoing quantum evolution. This can be particularly useful when the qubit is in the coherent regime where the energy barrier is low and quantum effects are strong.

Figure 6:
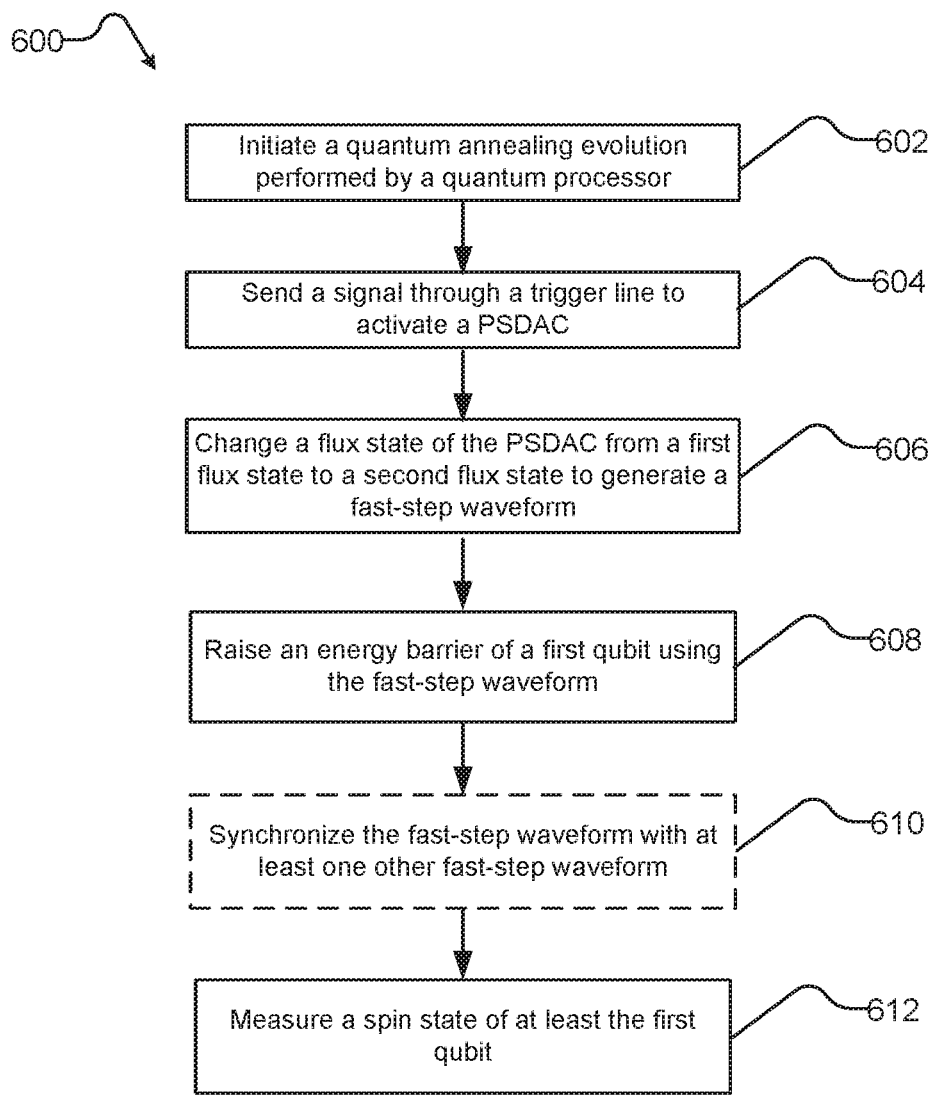
FIG. 6 is a flowchart illustrating a method for operating a system for projective measurement of a qubit, according to at least one illustrated embodiment of the present disclosure.

FIG. 6 is a flowchart illustrating a method 600 for operating a system for projective measurement of a qubit, according to at least one illustrated embodiment of the present disclosure. Method 600 starts at 602, for example in response to instructions received from a hybrid computing system or classical computing system. The hybrid computing system or classical computing system may prompt a quantum processor to initiate a quantum annealing evolution via a quantum annealing algorithm that is implemented in a quantum processor using a set of PMM DACs and/or other control circuitry. PMM DACs and other control circuitry can manipulate a set of qubit states according to a time-dependent Hamiltonian. At 604, during the quantum annealing evolution, a signal is sent through a trigger line to activate a PSDAC. Activating a PSDAC can include activating a JJ loop of the PSDAC through inductive coupling. At 606, the flux state of the PSDAC is changed from a first flux state to a second flux state to generate a fast-step waveform. At 608, the fast-step waveform generated by the change in flux state raises an energy barrier of a first qubit. Raising the energy barrier of the first qubit can include reducing the tunneling energy to freeze out a state of the first qubit. Optionally, at 610, the fast-step waveform is synchronized with at least one other fast-step waveform generated by a change in flux state of at least one other PSDAC. Synchronization can be performed via a synchronization device such as a PMM DAC or analog line. Act 610 can be performed when there is at least one additional qubit that is coupled to a respective PSDAC. At 612, a spin state of at least the first qubit is measured. If act 610 is performed, act 612 can include synchronously measuring spin states of the first qubit and at least one additional qubit.

In some implementations, prior to performing act 602, a PSDAC may be biased by a combination of a trigger line and a synchronization device, also referred to as "pre-biasing". The PSDAC may be biased to a value that is less than or equal to a bias applied when performing act 640. Such an approach can be beneficial in mitigating crosstalk between devices. In some implementations, after performing act 602, a flux offset in a body loop of a PSDAC can be compensated by applying a bias to the body loop of the PSDAC via an SFQ flux bias source or a flux bias DAC. Such an approach can reduce the change in flux applied to a qubit JJ loop and limit unintended partial annealing.

Figure 7:
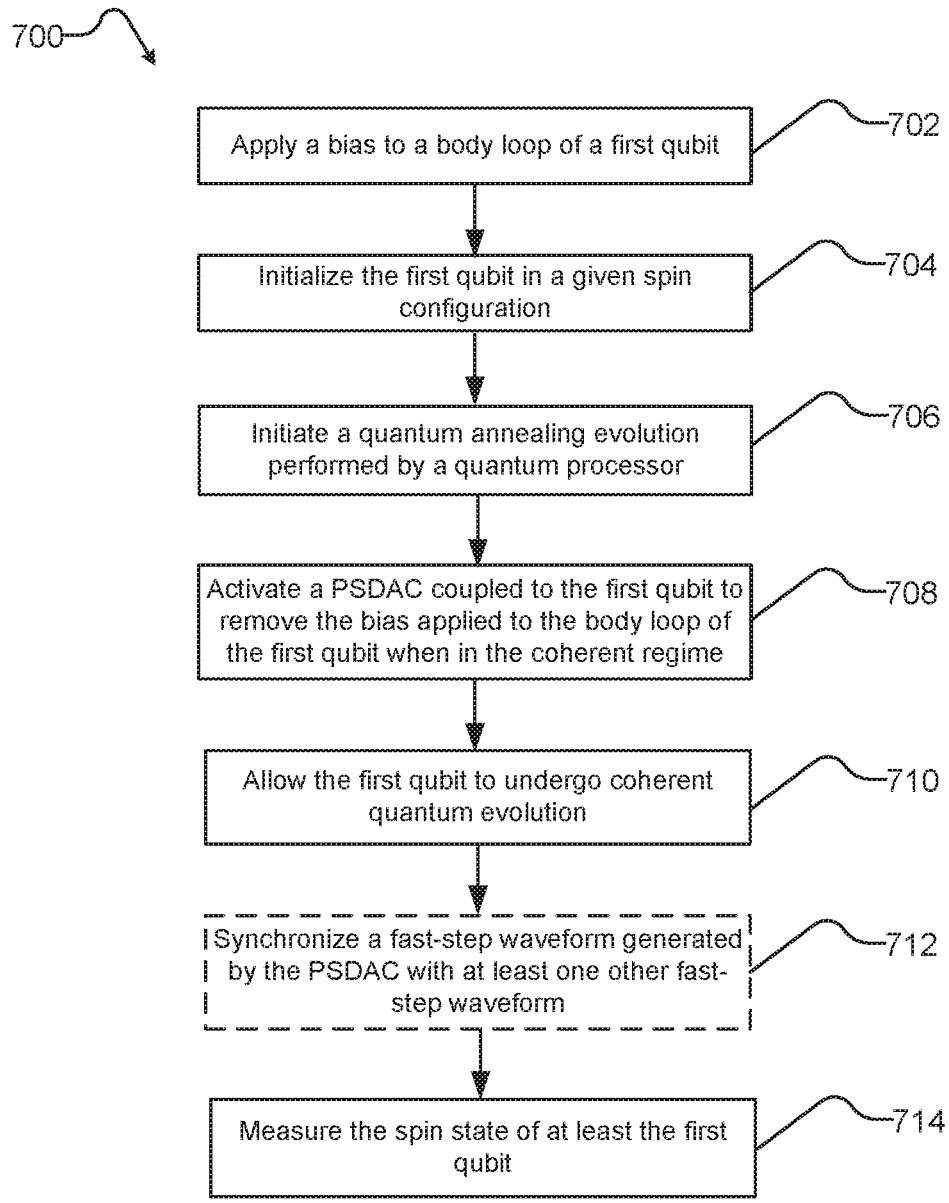
FIG. 7 is a flowchart illustrating a method for initiating and monitoring quantum evolution of a qubit, according to at least one illustrated embodiment of the present disclosure.

FIG. 7 is a flowchart illustrating a method 700 for initiating and monitoring quantum evolution of a qubit, according to at least one illustrated embodiment of the present disclosure. Method 700 starts at 702, for example in response to instructions received from a hybrid or classical computing system. A bias is applied to a body loop of a first qubit using a flux bias source such as a flux bias line or analog line. At 704, the first qubit is initialized in a given spin configuration. The hybrid computing system or classical computing system can give instructions that include an initial spin configuration which can evolve according to a time-dependent Hamiltonian. At 706, a quantum annealing evolution is initiated by a quantum processor. The hybrid computing system or classical computing system may prompt the quantum processor to initiate the quantum annealing evolution via a quantum annealing algorithm that is implemented using a set of PMM DACs and/or other control circuitry. At 708, when the first qubit is in the coherent regime, a PSDAC that is coupled to the first qubit is activated to remove the bias applied to the body loop of the first qubit. At 710, the first qubit undergoes coherent quantum evolution. During coherent quantum evolution, quantum effects are strong and the energy barrier is low. Optionally, at 712, a fast-flux step or fast-step waveform generated by the PSDAC is synchronized with at least one other fast-flux step or fast-step waveform. The at least one other fast-flux step or fast-step waveform can be generated by at least one other PSDAC. Act 712 can be performed when there is at least one additional qubit that is coupled to a respective PSDAC. At 714, a spin state of at least the first qubit is measured. If act 712 is performed, act 714 can include synchronously measuring spin states of the first qubit and at least one additional qubit.

Some elements of the present disclosure can be employed in a computing system that includes a digital computer and an analog computer such as a quantum computer. In some implementations, elements of the devices and methods illustrated in FIG. 1 to FIG. 7 can operate in response to instructions given by user via a digital computer. For example, a user may determine a bias to apply on a target device on a quantum processor. An algorithm that includes instructions to apply the bias on the target device may be implemented in a digital computer. The digital computer may communicate with the quantum computer to apply the bias to the target device on the quantum processor via on-chip chip DACs, analog lines, or other control circuitry on the quantum processor.

Figure 8:
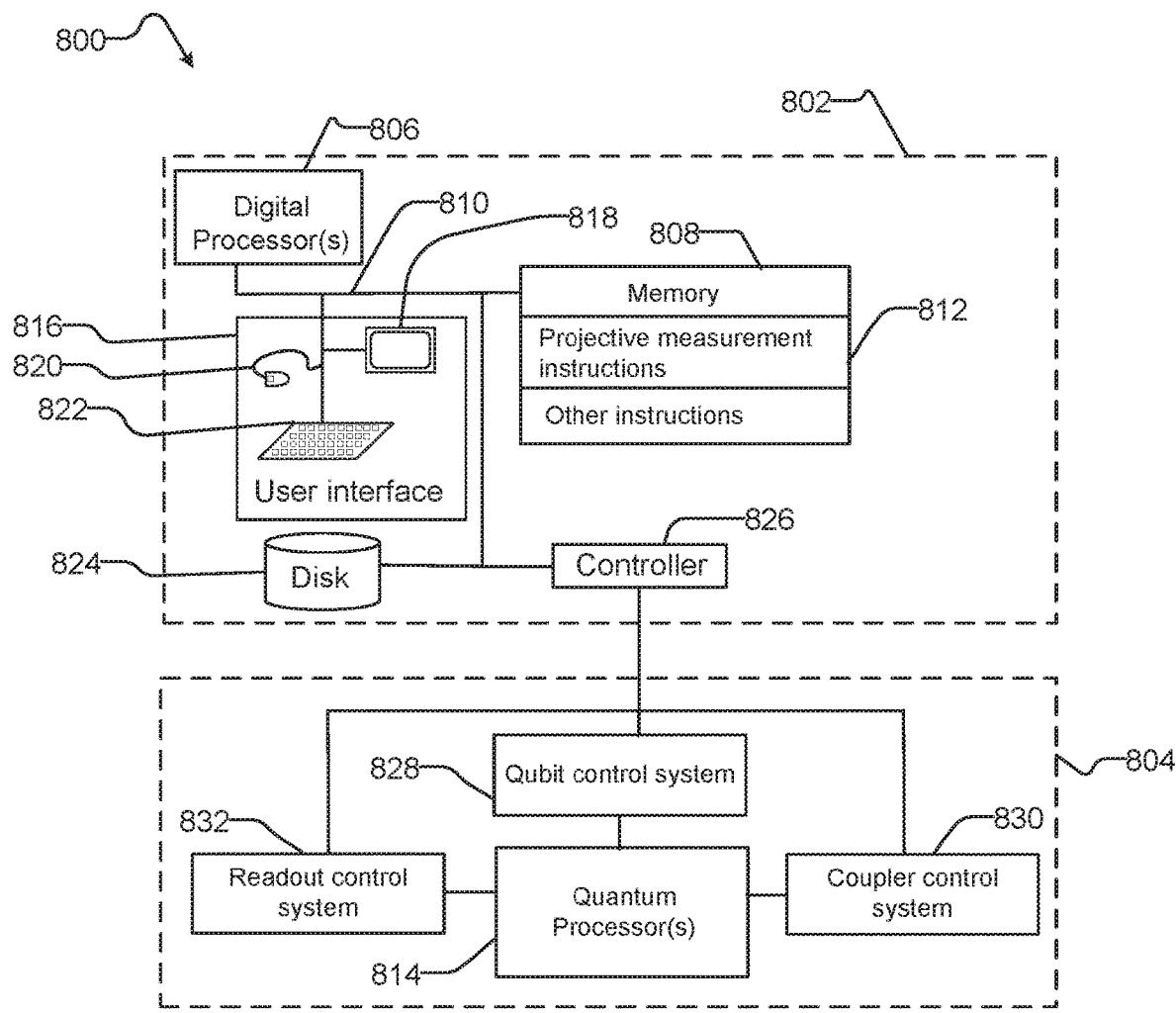
FIG. 8 is a schematic diagram of an exemplary computing system including a digital computer and an analog computer in accordance with the present systems, devices, and methods.

FIG. 8 illustrates a computing system 800 comprising a digital computer 802. The example digital computer 802 includes one or more digital processors 806 that may be used to perform classical digital processing tasks. Digital computer 802 may further include at least one system memory 808, and at least one system bus 810 that couples various system components, including system memory 808 to digital processor(s) 806. System memory 808 may store a projective measurement instructions module 812.

The digital processor(s) 806 may be any logic processing unit or circuitry (e.g., integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 800 comprises an analog computer 804, which may include one or more quantum processors 814. Digital computer 802 may communicate with analog computer 804 via, for instance, a controller 826. Certain computations may be performed by analog computer 804 at the instruction of digital computer 802, as described in greater detail herein.

Digital computer 802 may include a user input/output subsystem 816. In some implementations, the user input/output subsystem includes one or more user input/output components such as a display 818, mouse 820, and/or keyboard 822.

System bus 810 can employ any known bus structures or architectures, including a memory bus with a memory controller, a peripheral bus, and a local bus. System memory 808 may include non-volatile memory, such as read-only memory ("ROM"), static random access memory ("SRAM"), Flash NAND; and volatile memory such as random access memory ("RAM") (not shown).

Digital computer 802 may also include other non-transitory computer- or processor-readable storage media or non-volatile memory 824. Non-volatile memory 824 may take a variety of forms, including: a hard disk drive for reading from and writing to a hard disk (e.g., magnetic disk), an optical disk drive for reading from and writing to removable optical disks, and/or a solid state drive (SSD) for reading from and writing to solid state media (e.g., NAND-based Flash memory). The optical disk can be a CD-ROM or DVD, while the magnetic disk can be a rigid spinning magnetic disk or a magnetic floppy disk or diskette. Non-volatile memory 824 may communicate with digital processor(s) via system bus 810 and may include appropriate interfaces or controllers 826 coupled to system bus 810. Non-volatile memory 824 may serve as long-term storage for processor- or computer-readable instructions, data structures, or other data (sometimes called program modules) for digital computer 802.

Although digital computer 802 has been described as employing hard disks, optical disks and/or solid state storage media, those skilled in the relevant art will appreciate that other types of nontransitory and non-volatile computer-readable media may be employed, such magnetic cassettes, flash memory cards, Flash, ROMs, smart cards, etc. Those skilled in the relevant art will appreciate that some computer architectures employ nontransitory volatile memory and nontransitory non-volatile memory. For example, data in volatile memory can be cached to non-volatile memory. Or a solid-state disk that employs integrated circuits to provide non-volatile memory.

Various processor- or computer-readable instructions, data structures, or other data can be stored in system memory 808. For example, system memory 808 may store instruction for communicating with remote clients and scheduling use of resources including resources on the digital computer 802 and analog computer 804. Also for example, system memory 808 may store at least one of processor executable instructions or data that, when executed by at least one processor, causes the at least one processor to execute the various algorithms to execute instructions to perform projective measurement techniques described elsewhere herein. For instance, system memory 808 may store a projective measurement instructions module 812 that includes processor- or computer-readable instructions to generate a fast flux step or fast step waveform. Such provision may comprise applying a bias to a qubit or a PSDAC to generate a fast flux step to perform projective measurement of the qubit, e.g., as described in greater detail herein.

In some implementations system memory 808 may store processor- or computer-readable calculation instructions and/or data to perform pre-processing, co-processing, and post-processing to analog computer 804. System memory 808 may store a set of analog computer interface instructions to interact with analog computer 804. When executed, the stored instructions and/or data cause the system to perform projective measurement of at least one qubit by applying a bias via an analog line or on-chip DAC. For example, executing the stored instructions can result in sending a signal through a trigger line to activate a PSDAC in a circuit, such as circuit 100 of FIG. 1.

Analog computer 804 may include at least one analog processor such as quantum processor 814. Analog computer 804 can be provided in an isolated environment, for example, in an isolated environment that shields the internal elements of the quantum computer from heat, magnetic field, and other external noise (not shown). The isolated environment may include a refrigerator, for instance a dilution refrigerator, operable to cryogenically cool the analog processor, for example to temperature below approximately 1° Kelvin.

Analog computer 804 can include programmable elements such as qubits, couplers, and other devices. Qubits can be read out via readout system 832. Readout results can be sent to other computer- or processor-readable instructions of digital computer 802. Qubits can be controlled via a qubit control system 828. Qubit control system 828 can include on-chip DACs and analog lines that are operable to apply a bias to a target device. Couplers that couple qubits can be controlled via a coupler control system 830. Couple control system 830 can include tuning elements such as on-chip DACs and analog lines. Qubit control system 828 and coupler control system 830 can be used to implement a quantum annealing schedule as described herein on analog processor 804.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 7,876,248; 8,098,179; U.S. Provisional Patent Application No. 62/670,509; Johnson et al., "A scalable control system for a superconducting adiabatic quantum optimization processor", arXiv:0907.3757; and Bunyk et al., "Architectural considerations in the design of a superconducting quantum annealing processor", arXiv:1401.5504.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A system for projective measurement of qubits in a quantum processor, the system comprising:
   a plurality of qubits, each qubit having a body loop and a Josephson Junction (JJ) loop;
   a plurality of projective-source digital-to-analog converters (PSDACs), each PSDAC having a body loop and a JJ loop, wherein each body loop of each PSDAC is communicatively coupled to the JJ loop of a respective qubit of the plurality of qubits;
   one or more trigger lines, each of the one or more trigger lines respectively communicatively coupled to the JJ loop of one or more of the plurality of PSDACs such that each JJ loop is communicatively coupled to one of the one or more trigger lines, the one or more trigger lines operable to provide signals to activate each PSDAC to change from a first flux state to a second flux state, wherein activating each PSDAC to change from a first flux state to a second flux state generates a respective fast flux step; and
   a plurality of synchronization flux bias sources, each synchronization flux bias source communicatively coupled to the JJ loop of a respective PSDAC of the plurality of PSDACs, wherein each synchronization flux bias source is operable to apply a flux bias to the JJ loop of the respective PSDAC.

2. The system of claim 1 wherein the plurality of synchronization flux bias sources includes a plurality of programmable magnetic memory digital-to-analog converters (PMM DACs), each PMM DAC having a body loop communicatively coupled to the JJ loop of a respective PSDAC, the body loop of the PMM DAC operable to apply a bias to the JJ loop of a respective PSDAC.

3. The system of claim 1 wherein the plurality of synchronization flux bias sources includes a plurality of analog lines, each analog line communicatively coupled to the JJ loop of a respective PSDAC and operable to apply a bias to the JJ loop of a respective PSDAC.

4. The system of claim 1 wherein the first flux state of a first PSDAC of the plurality of PSDACs is different from the first flux state of a second PSDAC of the plurality of PSDACs.

5. The system of claim 1 wherein a first fast flux step generated by a first PSDAC of the plurality of PSDACs is applied to a JJ loop of a first qubit of the plurality of qubits.

6. The system of claim 5 wherein each synchronization flux bias source synchronizes the first fast flux step generated by the first PSDAC of the plurality of PSDACs with a second fast flux step generated by a second PSDAC of the plurality of PSDACs.

7. The system of claim 6 wherein synchronizing the first fast flux step generated by the first PSDAC of the plurality of PSDACs with a second fast flux step generated by a second PSDAC of the plurality of PSDACs provides synchronized fast flux steps that are each applied to the JJ loop of the first qubit and a JJ loop of a second qubit of the plurality of qubits.

8. The system of claim 5 wherein each synchronization flux bias source synchronizes the first fast flux step generated by the first PSDAC of the plurality of PSDACs with a plurality of fast flux steps generated by each PSDAC of the plurality of PSDACs.

9. The system of claim 8 wherein synchronizing the first fast flux step generated by the first PSDAC of the plurality of PSDACs with a plurality of fast flux steps generated by each PSDAC of the plurality of PSDACs provides synchronized fast flux steps that are each applied to a respective JJ loop of each qubit of the plurality of qubits.

10. The system of claim 1 further comprising a plurality of body flux bias sources, wherein each body flux bias source is communicatively coupled to a body loop of a respective PSDAC and each body flux bias source is operable to apply a flux bias to the body loop of the respective PSDAC.

11. The system of claim 1 further comprising a coupler communicatively coupling a first qubit of the plurality of qubits to a second qubit of the plurality of qubits, wherein the first qubit is communicatively coupled to a first PSDAC of the plurality of PSDACs and the second qubit is communicatively coupled to a second PSDAC of the plurality of PSDACs.

12. The system of claim 11 wherein a first trigger line of the one or more trigger lines is communicatively coupled to the JJ loop of the first PSDAC of the plurality of PSDACs and the first trigger line is further communicatively coupled to the JJ loop of the second PSDAC of the plurality of PSDACs.

13. The system of claim 12 wherein the JJ loop of the first PSDAC of the plurality of PSDACs is communicatively coupled to a first synchronization flux bias source of the plurality of synchronization flux bias sources and the JJ loop of the second PSDAC of the plurality of PSDACs is communicatively coupled to a second synchronization flux bias source of the plurality of synchronization flux bias sources.

14. The system of claim 13 further comprising a third PSDAC and a fourth PSDAC of the plurality of PSDACs, wherein the body loop of the third PSDAC of the plurality of PSDACs is communicatively coupled to the body loop of the first qubit of the plurality of qubits and the body loop of the fourth PSDAC of the plurality of PSDACs is communicatively coupled to the body loop of the second qubit of the plurality of qubits.

15. The system of claim 14 wherein the JJ loop of the third PSDAC of the plurality of PSDACs is communicatively coupled to a second trigger line of the one or more trigger lines.

16. A method of operation of a system for projective measurement of a qubit in a quantum processor, the system including:
   a plurality of qubits, each qubit having a body loop and a Josephson Junction (JJ) loop;
   a plurality of projective-source digital-to-analog converters (PSDACs), each PSDAC having a body loop and a JJ loop, wherein each body loop of each PSDAC is communicatively coupled to the JJ loop of a respective qubit of the plurality of qubits;
   one or more trigger lines, each of the one or more trigger lines respectively communicatively coupled to the JJ loop of one or more of the plurality of PSDACs such that each JJ loop is communicatively coupled to one of the one or more trigger lines, the one or more trigger lines operable to provide signals to activate each PSDAC to change from a first flux state to a second flux state, wherein activating each PSDAC to change from a first flux state to a second flux state generates a respective fast flux step; and
   a plurality of synchronization flux bias sources, each synchronization flux bias source communicatively coupled to the JJ loop of a respective PSDAC of the plurality of PSDACs, wherein each synchronization flux bias source applies a bias to the JJ loop of the respective PSDAC, the method comprising:
   initiating a quantum annealing evolution performed by the quantum processor;
   at a point during the quantum evolution:
      sending a signal through a first trigger line of the one or more trigger lines to activate a PSDAC of the plurality of PSDACs;
      changing a flux state of the PSDAC of the plurality of PSDACs from a first flux state to a second flux state to generate a first fast flux step;
      raising an energy barrier of a qubit of the plurality of qubits using the fast flux step; and
      measuring a spin state of the qubit of the plurality of qubits.

17. The method of claim 16 further comprising synchronizing the first fast flux step generated by the first PSDAC of the plurality of PSDACs with a plurality of fast flux steps generated by a respective PSDAC of the plurality of PSDACs.

18. The method of claim 17 wherein synchronizing the first fast flux step generated by the first PSDAC with a plurality of fast flux steps generated by a respective PSDAC of the plurality of PSDACs provides synchronized fast flux steps that are each applied to a respective JJ loop of each qubit of the plurality of qubits.

19. The method of claim 18 wherein applying synchronized fast flux steps to a respective JJ loop of each qubit of the plurality of qubits raises a respective energy barrier of each qubit of the plurality of qubits.

20. The method of claim 16 further comprising completing the quantum evolution and reading out the spin state of the qubit of the plurality of qubits.

* * * * *